US011971433B2

(12) United States Patent
Muehlschlegel

(10) Patent No.: US 11,971,433 B2
(45) Date of Patent: Apr. 30, 2024

(54) CURRENT MEASURING DEVICE FOR SWITCHED-MODE POWER CONVERTERS AND REGULATION CIRCUIT FOR APPLICATION OF THE CURRENT MEASURING DEVICE

(71) Applicant: OSRAM GmbH, Munich (DE)

(72) Inventor: Joachim Muehlschlegel, Groebenzell (DE)

(73) Assignee: Inventronics GmbH, Munich (DE)

( * ) Notice: Subject to any disclaimer, the term of this patent is extended or adjusted under 35 U.S.C. 154(b) by 218 days.

(21) Appl. No.: 17/719,383

(22) Filed: Apr. 13, 2022

(65) Prior Publication Data

US 2022/0334150 A1 Oct. 20, 2022

(30) Foreign Application Priority Data

Apr. 15, 2021 (DE) .................. 10 2021 203 742.9

(51) Int. Cl.
*G01R 19/00* (2006.01)
*G01R 19/02* (2006.01)
*H02M 1/00* (2006.01)
*H02M 1/32* (2007.01)
(Continued)

(52) U.S. Cl.
CPC .......... *G01R 19/02* (2013.01); *H02M 1/0009* (2021.05); *H02M 1/32* (2013.01); *H02M 3/156* (2013.01); *H05B 45/3725* (2020.01)

(58) Field of Classification Search
CPC .... G01R 19/02; G01R 19/0015; G01R 1/203; H02M 1/0009; H02M 1/0048; H02M 1/32; H02M 3/00; H02M 3/156
See application file for complete search history.

(56) References Cited

U.S. PATENT DOCUMENTS

| | | | | |
|---|---|---|---|---|
| 9,778,286 B2* | 10/2017 | Gouzman | ............... | G01R 15/14 |
| 2010/0079125 A1* | 4/2010 | Melanson | ........... | H02M 1/4225 |
| | | | | 323/285 |
| 2020/0169124 A1* | 5/2020 | Mehas | .................... | H02J 50/12 |

FOREIGN PATENT DOCUMENTS

| | | |
|---|---|---|
| EP | 2446708 A1 | 5/2012 |
| WO | 2008132501 A2 | 11/2008 |
| WO | 2010150183 A1 | 12/2010 |

OTHER PUBLICATIONS

Search Report for German Patent Application No. 10 2021 203 742.9, dated Jan. 18, 2022, 6 pages (For reference purposes only).

(Continued)

*Primary Examiner* — Thang X Le

(74) *Attorney, Agent, or Firm* — Samson G. Yu

(57) ABSTRACT

A current measuring device for switched-mode electronic power converters includes two independent sensors connected in series for the current to be measured, one of said sensors providing an admittance and the other providing a conductance. The current measuring device further includes a parallel current measuring resistor and an average value capacitor which are connected in parallel contribute to the provided admittance. The conductance is provided by a serial current measuring resistor as one of the sensors. The current to be measured has both DC and AC current components. The current measuring device further includes a filter is transferred back into the power path or merged with the current measuring sensors.

18 Claims, 11 Drawing Sheets

(51) Int. Cl.
*H02M 3/156* (2006.01)
*H05B 45/3725* (2020.01)

(56) References Cited

OTHER PUBLICATIONS

DE search report issued Jan. 18, 2022 re: Application No. DE102021203742, pp. 8.

* cited by examiner

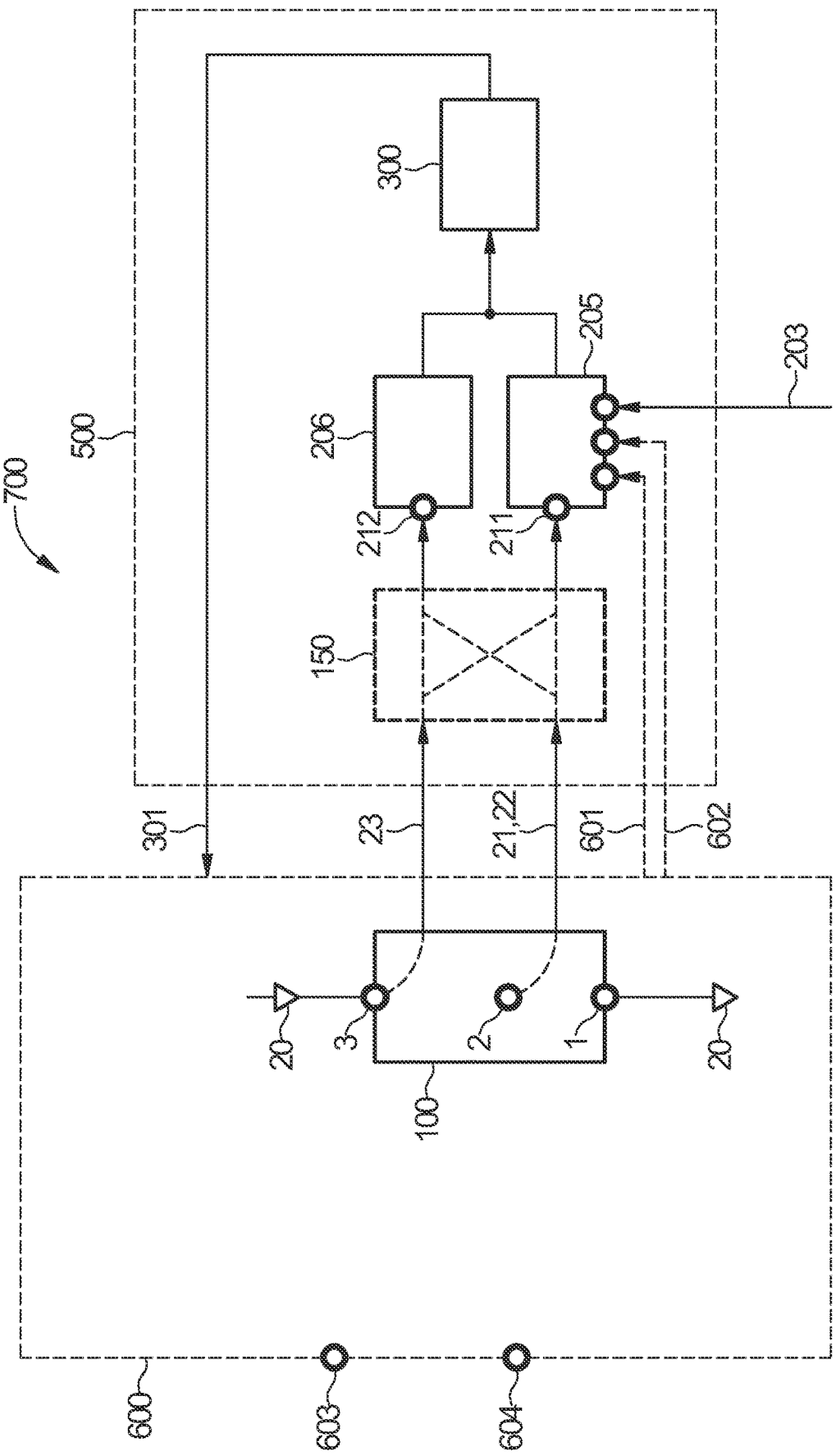

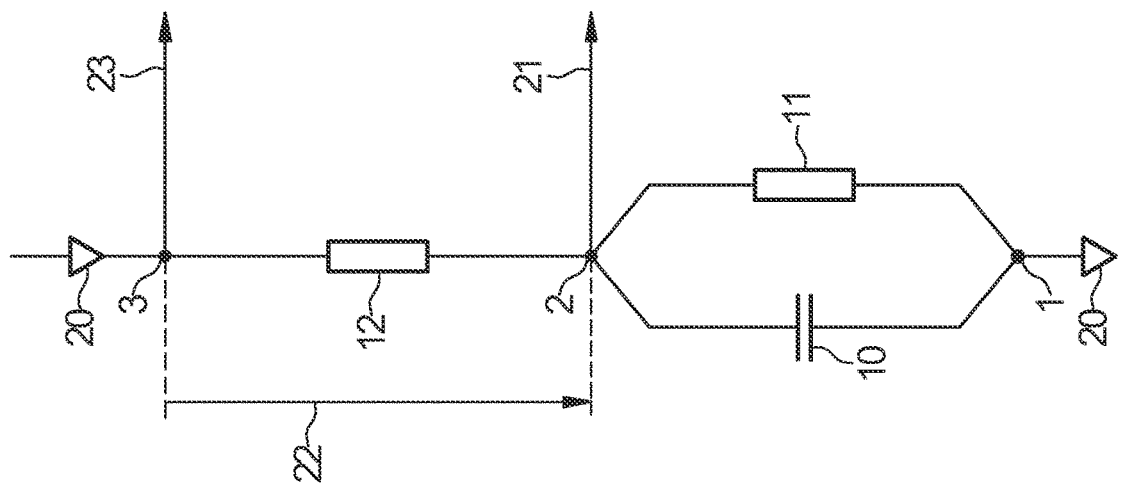
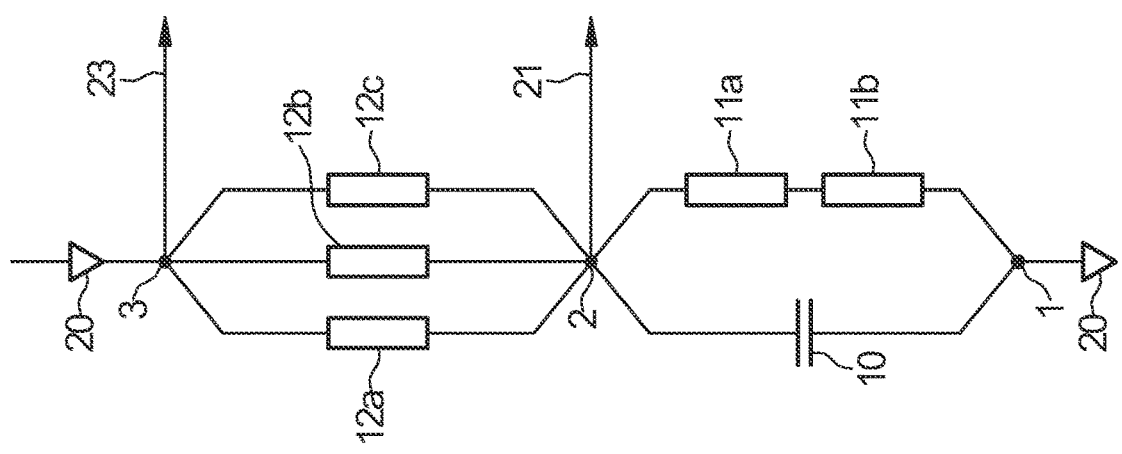
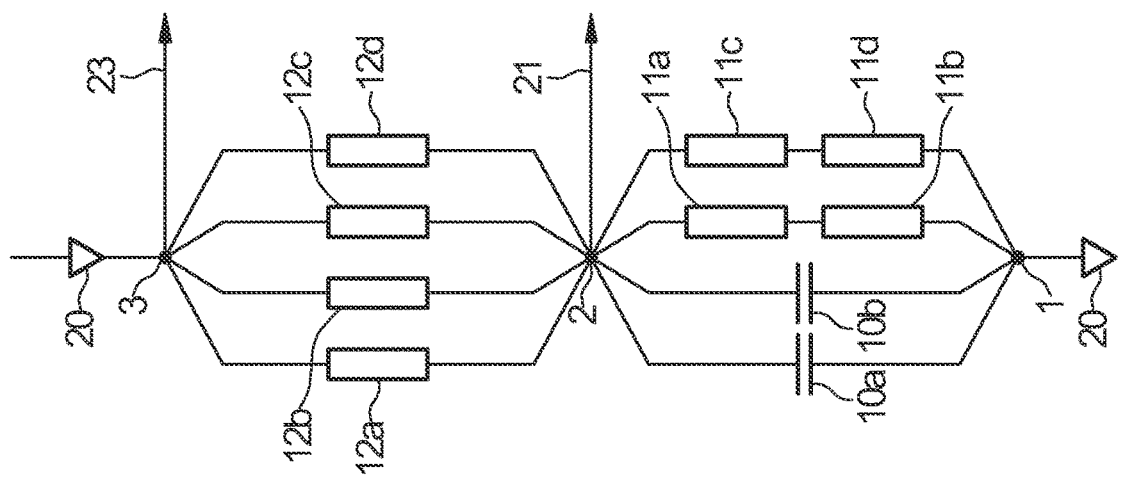

CURRENT MEASURING DEVICE FOR SWITCHED-MODE POWER CONVERTERS AND REGULATION CIRCUIT FOR APPLICATION OF THE CURRENT MEASURING DEVICE

RELATED APPLICATION(S)

This application claims priority under 35 U.S.C. § 119(a) and 35 U.S.C. § 365(b) from German Patent Application 10 2021 203 742.9, filed on Apr. 15, 2021; the disclosure of which is incorporated herein by reference in its entirety.

TECHNICAL FIELD

Various embodiments of the present disclosure relate to current measuring device for currents having high AC current components such as occur in particular in switched-mode electronic power converters. The measurement has to be filtered owing to said AC current components. Various embodiments of the present disclosure relate to a regulation circuit for such switched-mode power converters. Switched-mode electronic power converters are contained in particular in plug-in power supply units, simple power supplies, switched-mode power supplies, laboratory power supplies, DC converters, DC-DC converters, active current sources, active voltage sources or operating devices for light sources, such as for light emitting diodes.

BACKGROUND

Electronic circuits for converting electrical energy or power are nowadays usually operated in switched-mode fashion and almost always have to be regulated. For this purpose, within such a switched-mode electronic power converter, those electrical signals which are the most meaningful with regard to the at least one variable to be regulated have to be measured in order to be able to report the measurement values thus obtained as feedback variables to the regulator. If e.g. a power is intended to be regulated to its target value, it is necessary to measure at least one signal representing a voltage causing the power under consideration, and additionally at least one second signal representing a current causing the same power.

Just one or the other is often sufficient, however. If said power converter is intended to operate as an active voltage source or as a DC-DC converter, only the signal representing its output voltage is processed in its regulation. Conversely, if only the signal representing the output current is processed there, the power converter operates as an active current source or as a DC converter. The respectively open, i.e. non-regulated, variable is defined by the electrical load currently connected to the power converter under consideration.

Signals representative of such open variables should nevertheless be concomitantly measured in most cases. In this way, a voltage source or a DC-DC converter acquires overload protection which intervenes in the event of a maximum allowed load current and turns the actual voltage source into a current source, thereby preventing the load current from becoming greater than the maximum allowed load current. Simple power supplies constructed in this way, such as e.g. plug-in power supply units, in contrast to their designation, are regulated to their output voltage during normal operation. In this way, an active current source or a DC converter acquires no-load stability, which is essential in particular for power converters which are intended to generate a so-called safety extra low voltage ("SELV"). This is because without a load a current source would generate infinitely high output voltages. With concomitant measurement of the output voltage, the latter can be effectively limited to a maximum allowed value, e.g. 54 V or 60 V. This operating mode "current source characteristic with voltage limiting" is the one that occurs the most frequently in the case of operating devices for light emitting diodes.

At a more universal level there are so-called laboratory power supplies, which depending on load and instantaneous setting can accomplish both aspects above and are usually constructed as switched-mode power supplies, i.e. then contain at least one switched-mode electronic power converter as energy supply. In that case, usually two regulating circuits are arranged in parallel with one another, of which regulating circuits it is always the one with the more stringent target value restriction that currently intervenes and regulates the power converter. The physically open variable also remains open in each case in the regulation. Alternatively, these two regulations are cascaded in one another, the current regulation usually being subordinate. This is because a current sink, owing to its voltage impressing, makes the ever present output capacitor dynamically ineffective, for which reason a current regulation is simpler to stabilize than a voltage regulation. Both arrangements lead—at least theoretically—to a rectangular operating range in an IU diagram spanned by the load current as x-axis and by the output voltage as y-axis. A maximum power must be processable by the power converter and can be retrieved only at a single point, however, namely at the "top right corner" of the operating range with maximum load current and simultaneously maximum output voltage, which leads to a very poor utilization of the components of the switched-mode electronic power converter provided for this.

All switched-mode electronic power converters include in each case at least one storage capacitor and at least one storage inductance or storage coil or storage inductor and also at least one rectifier diode and at least one actively controllable power transistor. This has already outlined the three simplest power converter topologies of buck converter, boost converter and buck-boost (or flyback) converter. The latter requires two storage capacitors. If two storage inductances are acquired instead, which can also be coupled, and if the now once again one storage capacitor ends up between power transistor and rectifier diode, a Ćuk converter can be designed therefrom. Proceeding from the Ćuk converter, the Zeta converter and SEPIC (single-ended primary inductor converter) additionally require a second storage capacitor, the Zeta converter at its input and the SEPIC at its output. The forward converter, which is only apparently derived from the buck converter, requires over and above this very simple converter two further diodes and a three-winding transformer. If two actively controllable power transistors are used in the same power converter topology, this gives rise to either improved forward converters, improved buck-boost converters or combinations thereof, the synchronous variants of the six simple converter topologies above from the buck converter to the SEPIC or their associated bidirectional converters, push-pull circuits or half-bridges. The latter require at least one further storage capacitor in series with the storage inductance besides at least one additional rectifier diode, said at least one further storage capacitor taking up the DC voltage component of the half-bridge output voltage. If this series capacitor together with the storage inductance, which in the case of half-bridges is advantageously realized at least partly by a transformer, forms a resonant circuit with a natural frequency just below a lowest clock frequency, this gives rise to a resonant LLC converter. If a pure resonance capacitor is additionally connected in parallel with said transformer, this results in a so-called resonant LCC converter.

All these are power converters often in the literal sense as well: they can handle the "top right corner" above, without a significant change to their circuit, but they can equally well supply double the voltage and in return only half the load current or else double the load current with only half the output voltage. The constant power hyperbola thus produced considerably increases the possible operating range and thus the utilization of the switched-mode electronic power converter within a power supply under consideration. However, this necessitates thirdly the power regulation already mentioned right at the start, which acts as a cross between voltage regulation and current regulation. The measurement values are multiplied, and if this product exceeds a predefined power or a maximum power, a third parallel regulating circuit intervenes, which regulates the power converter to the currently predefined power or to its maximum permissible output power. As an alternative thereto, the voltage or current target values can be correspondingly reduced particularly if a constant power hyperbola can be approximated by a downward sloping straight line spanning it, or if cascaded regulation is present. Many modern operating devices for light emitting diodes in all areas of lighting are constructed in this way, i.e. can also operate along a hyperbola of identical or maximum power. Without an appreciable increase in costs, many different loads, for example light emitting diode modules, can thus be supplied alternatively by one and the same operating device. Moreover, all systems produced in this way can be dimmed over almost the full brightness range, i.e. from brightnesses of 100% to <1%, e.g. by way of the communication protocols DALI, DMX, KNX, EIB or RS488. It goes without saying that wireless communication protocols such as Bluetooth, ZigBee or Thread can also be used. An operating device suitable for such systems and also the switched-mode electronic power converter installed therein must then cover a particularly large operating range which extends close to or even touches the y-axis of the above IU diagram. If the switched-mode electronic power converter used in the operating device, particularly if said power converter is of resonant construction, has a natural operating limit, the latter can also be used for power limiting by means of simultaneous shutdown of current and voltage regulating circuits. Nevertheless, in all power converters for operating devices, laboratory power supplies, switched-mode power supplies, DC-DC or DC converters, active voltage or current sources or the like, at least two electrical variables which are substantially independent of one another must be measured permanently.

However, this "permanently" contradicts the initially mentioned "switched-mode", characteristic of the operation of a power converter under consideration. In order that such clocking achieves the desired effect, firstly one of the power converter topologies already mentioned above is required. As a result of the clocking, secondly, the driving of the at least one actively controllable power transistor contained in the power converter topology is pulse-width-modulated (PWM), in principle, i.e. exhibits a period duration T, a switch-on time and a switch-off time. The sum of the last two yields the period duration or, in general terms, one of the three times is always dependent on the other two. This time subdivision, i.e. all signal waveforms caused by the clocking, e.g. zero pauses, edges, gradients, peak values and the like and also all associated points in time or time intervals, is the characteristic that most clearly defines switched-mode operation of a power converter. Thirdly, in that case each power transistor is either only ever fully switched on, activated, operated in saturation, or else completely switched off. Here the term "power converter" likewise always encompasses DC converters, DC-DC converters, switched-mode power supplies, power supplies, operating devices for LEDs, etc.

Minimizing the losses in the power converter still further is the motivation for this proposal of a current measuring device for switched-mode power converters. This is because losses occur not only in the power converter topology per se, but also during the measurement of its instantaneous electrical variables, in particular during the measurement of currents. For reasons of costs, speed, accuracy and anti-aging, the current to be measured is very often conducted through a current measuring resistor, the non-infinite conductance of which generates a voltage that is measurable across said resistor and serves as a signal for the current to be measured. The resistance of this current measuring resistor is calculated from the measurement voltage required for the evaluation divided by the maximum current to be measured and becomes all the higher, the more cost-effective or more inaccurate the evaluation circuit provided is or the more accurate the evaluation has to be. This is because a measurement voltage that is all the higher is then required. This last is the cause that prompted this invention, which reveals a second calculation specification for current measuring resistors that is relevant particularly at the left-hand edge of an operating range of a power converter: the voltage resolution of the evaluation circuit, e.g. µV per bit, divided by the current difference necessary for a smallest measurable or visible brightness difference for e.g. an LED operating device, which can lead to even significantly higher resistances of current measuring resistors with even higher losses. The second contradiction that arises as a result is "resolution or accuracy of the measurement" versus "measurement losses", the resolution at the left-hand edge of an operating range, e.g. at a dimming level of 1%, being predefined by the DALI standard, inter alia, and having to be particularly fine owing to the logarithmic eye characteristic curve there. In the case of customary evaluation circuits and in the case of known solutions, this necessarily drives up the measurement losses or the measurement and evaluation outlay or both at the same time.

The first contradiction between "permanently" and "switched-mode" results in a further idiosyncrasy in the power converters under consideration here. Their regulation requires the permanence of the measurement, but often the measured signals are in no way continuous on account of the clocking. They thus have to be filtered, in principle, before they can be fed to a regulation. The regulator or the compensation or negative feedback circuit thereof can also include the filter required for this purpose. In this case, a cut-off frequency of the regulated power converter, that is to say e.g. a frequency for an assumed modulation in the target value for an output variable which the regulated power converter can transfer to its output substantially still without attenuation, is always significantly lower than its clock frequency. The latter corresponds to the reciprocal of the above period duration T of the pulse width modulation and is typically at least ten times the magnitude of said cut-off frequency, which is also influenced by the time constants of the filters for the measurement signals, which are usually low-pass filters. From a dynamic standpoint, the entire system including measurement, regulation and clocking with consequently actual energy transfer in the power converter topology is always significantly slower than the clocking as such.

Since any power converter topology includes, besides the power transistors, which chop one continuum, and the rectifier diodes, which generate another continuum from what has been chopped, substantially only reactive elements which operate approximately without losses and form average values, in principle, by virtue of their integrating properties, these continua may be calculated according to the averaging method, which is also known as "state space averaging" in the literature: the average value of each chopped signal is likewise representative of a signal of a continuum, usually even only differentiated by a constant factor, often two or four, or by a factor dependent on the duty cycle of the above pulse width modulation (PWM), or by further obvious factors. Said duty cycle is the ratio between switch-on time and period duration within the same currently considered period of a clocking. Any low-pass filter is the technical counterpart of an averaging, i.e. yields the results representative of the continua, often even automatically taking account of a duty cycle.

An advantage of the direct measurement of chopped variables (i.e. the measurement of the time profiles or instantaneous values of the variables current and/or voltage without essential low-pass filtering) is the additional information content thereof with regard to the time subdivision. In particular, specific events, e.g. the attainment of a power transistor maximum current, can be assigned to discrete points in time which can be directly converted into corresponding counteracting drive actions (e.g. overcurrent protection for the transistor or switch-off of the transistor per period of a clocking).

Measuring such chopped variables thus facilitates the return path, not described previously, for forming a clocked driving for the at least one power transistor again from the continuous regulator output signals. The same measurement signal low-pass-filtered can simultaneously be fed to the input of the associated regulator e.g. as a feedback variable.

Measuring chopped variables as such is manifested in particular in those power converters which, besides a voltage and current value change between input and output, additionally have to provide a galvanic isolation between their input and output. All power converters for the safety extra low voltage (SELV) already mentioned have this as an obligatory requirement in order that their output lines are permitted to remain touchable even during operation. In order nevertheless to be able to transfer power across the galvanic barrier, transformers have to be integrated into the power converter topologies, which are situated between power transistor(s) and rectifier diode(s) in a manner oriented toward the power flow. As a result, any such topology is divided into a primary side having the input, the at least one power transistor and at least one primary winding on the transformer, and into a secondary side having at least one secondary winding on the same transformer, the at least one rectifier diode and the output. The minimal topology precisely therefor (which is why it is also so popular) is the flyback converter, with a respective storage capacitor connected in parallel with its input and output. Primary current and secondary current in transformers may have DC current components, whereas primary voltage and secondary voltage are pure AC variables. All four variables thus contain dominant AC components, all of which are concomitantly measured.

An added difficulty in the case of these isolated or isolating power converters is that the driving of the power transistors has to take place on the primary side, but the important variables load current and output voltage are present on the secondary side. Since regulation and driving of the power transistor particularly advantageously take place on the same side, i.e. on the primary side, measurement should also take place there. The same transformer that transfers the power to the secondary side can simultaneously transfer some of the variables to be measured back from there to the primary side, which in that case however are usually pure AC variables, i.e. precisely the chopped variables. The transformer primary voltage during the periods in which the power transistor is switched off often represents the present output voltage, and the current through a switched-on power transistor, i.e. often the transformer primary current, often represents the present output current. The measurement values of chopped variables can thus be assigned to different actual variables depending on the present state of the clocking. Finally, galvanic barriers particularly advantageously become transmissive for measurements if chopped variables are measured.

In known power converters, almost without exception every measurement is passed firstly via a—occasionally small, i.e. "fast"—measurement low-pass filter, the series resistor of which has a relatively low resistance and the filter capacitor of which is relatively small. The main reason for this, besides the above, is that switched-mode power converters are strong sources of electromagnetic interference radiation. Such high-frequency interference with frequencies amounting to x times the clock frequency where x>>1, may not only distort the important average values, because they actually occur clock-synchronously, but primarily also nullify the information about the time subdivision, which is actually intended to be contained in some measurement signals. A consequence thereof is jitter and bifurcations through to instabilities.

In EP 2 446 708 A1, for example, a voltage is to be measured which is chopped and may be subjected to interference, evident from FIG. 5 therein. The measure to counteract that is shown in FIG. 8 therein: a measurement voltage divider consisting of two series-connected resistors connected between the voltage to be measured reduces the original voltage, which is much too high for an evaluation circuit, to a processable value which, in relation to the total resistance of the entire voltage divider, corresponds to the resistor coupled in parallel with the evaluation circuit. For the low-pass filtering of this reduced measurement signal, a small capacitor is in turn connected in parallel with said resistor coupled in parallel; both components are connected to circuit ground. Although the measuring circuit therein as such is identical to the simplest variant of the proposed current measuring device for switched-mode power converters, it nevertheless differs significantly: in that case, no current to be measured flows through the measuring circuit, in particular through the capacitor involved in the measurement low-pass filter, since a voltage is intended to be measured. In that case, both resistors have a very high resistance as usual for measurement voltage dividers, and the capacitor is small, lying, e.g. in the nanofarad rage.

A filtered current measurement is shown e.g. in WO 2008/132501 A2. At the top left in FIG. 9 therein, a similar measuring structure is shown, namely a measurement voltage divider having a capacitor in parallel with only one of the voltage divider resistors. In contrast to above, in parallel therewith there is only the actual current measuring resistor, which has a significantly lower resistance than both voltage divider resistors, i.e. has a significantly higher conductance than them. However, since said capacitor here is connected in parallel with the resistor remote from the circuit ground, a measurement high-pass filter is present. Furthermore, the evaluation circuit provided for this has to be able to process negative measurement signals.

In order to keep the losses low, the measuring resistor for the current measurement has to have the lowest possible resistance. For a switched-mode power supply or a power supply or an LED operating device with a nominal output power of 40 W, values of 0.1 ohm to 0.5 ohm, or to 0.25 ohm, have proved worthwhile for a concentrated current measuring resistor. Any filter connected thereto then once again has a significantly higher resistance. The customary procedure involves any filter connected downstream of an actual measurement, such as e.g. the measurement low-pass filter already mentioned, being given the highest possible resistance or being integrated into the measurement if the measurement itself already proceeds with a very high resistance, such as in the case of a voltage measurement, for example.

If the measurement voltages across the low-resistance current measuring resistor do not satisfy the requirement of resolution, however, they can be linearly amplified. Since most linear amplifiers have negative feedback, i.e. include for example an operational amplifier and a compensation branch, a filter connected upstream of this amplification can be realized by the negative feedback or by the compensation branch. Good linear amplifiers usually operate in an inverting fashion, which requires either a subtraction of the measurement signal from a known constant variable or else negative measurement signals.

For the latter the amplifier would have to be supplied in a bipolar fashion, which is often not provided. Non-inverting amplifiers make do with a simple voltage supply, but suffer from drift and offset problems. The measures to combat these inaccuracies are complex and expensive.

The losses in all current measuring resistors are oriented toward the root mean square values of the variables present at said resistors. Said root mean square values are all the higher in comparison with the average values, the less continuous the variables present are. The actual losses thus not only progress proportionally to the average value of the measured variable, but rather furthermore increase all the more, the more discontinuous the variable to be measured is. The losses in current measuring resistors are proportional to the square of the root mean square value of a current to be measured. The root mean square value, which represents the degree of the discontinuity very well, is always specified hereinafter as a ratio to the average value of the same current over time. The square of this ratio corresponds to a saving factor.

The measurement—expedient as shown above—of chopped variables in switched-mode electronic power converters thus leads to particularly high measurement losses, particularly if the variable to be measured is a chopped current. In applications provided therefor, the root mean square values can be up to 3 times the magnitude of the associated average values, 2.36 times the magnitude in one case actually examined, and the measurement losses are correspondingly high.

Finally, a measurement of a chopped current where said measurement is purely proportional to a time profile or instantaneous value is particularly unfavorable for the resolution in an evaluation circuit if principally the average value of the same chopped current is intended to be evaluated there.

Various embodiments of the present disclosure can address problems related to specifying a current measuring device which, with a given resolution for an evaluation circuit connected thereto, generates lower losses than the known solutions or which, for a higher resolution, does not generate higher losses but rather as a maximum the same losses as a realization in accordance with a known solution with lower resolution, or which enables a combination thereof, i.e. reduced losses with at the same time an increased resolution. One known solution is a concentrated current measuring resistor, for example, through which a usually chopped current flows. Various embodiments of the present disclosure furthermore can address problem related to specifying a current measuring device for switched-mode electronic power converters which is able to be connected serially into arbitrary branches of power converter topologies in which currents with a high AC current component flow.

Furthermore, current measuring devices described in embodiments of the present disclosure can avoid the occurrence of negative measurement signals, even if the variable to be measured is negative in portions.

Finally, it may be advantageous to realize a logarithmic transfer characteristic curve required for the overall system, including the power converter, its measurement, its regulation and its load, at least partly already in the current measuring device. In particular, what is striven for is to separately weight and evaluate (e.g. in the controlling microcontroller) an average value over time of a chopped current to be measured and, in parallel therewith, to separately evaluate and weight the chopped current (i.e. the measurement signal of the instantaneous value without low-pass filtering).

Various embodiments of the present disclosure address problems related to specifying a regulation circuit configured for such a current measuring device which can carry out an evaluation of the signals of the current measuring device.

SUMMARY

Various embodiments describe current measuring devices and address above noted problems with regard to current measuring devices described in the according to the invention, and by means of the features of with regard to the regulation circuit according to the invention.

In contrast to the customary procedure of designing all the measurement filters with the highest possible resistance and connecting them in parallel with the actual measurement, various embodiments of the present disclosure include a filter positioned in a power path. This makes it possible that the AC current components of the current to be measured can flow approximately without losses through a so-called average value capacitor. The current measuring device can form a plurality of measurement voltages simultaneously, which can be evaluated separately by evaluation circuits in function blocks, the function blocks being designed for the application of the current measuring device and being part of a regulation circuit for switched-mode power converters.

A filter for a current measurement is thus inserted into the power path. As a result, this filter has a very low resistance, i.e. is counter to the customary procedure of designing any filter for measurement purposes such as the measurement low-pass filter already mentioned, for example, with the highest possible resistance. A current measuring device for switched-mode power converters therefore includes at least two mutually independent sensors, that is to say e.g. two different resistors or two purely resistively equipped branches, which are connected in series with one another and thus considered together touch three nodes, that is to say at least two independent current measuring resistors through which the current to be measured flows equally at least proportionately. The node touched by both current measuring resistors or by both purely resistive branches is a second node. The current to be measured flows as a whole through at least one of the current measuring resistors, which is also called "serial current measuring resistor", and only proportionately through the at least one remaining current measuring resistor. This is because there is connected in parallel therewith a filter capacitor completing the required filter and thus the current measuring device for switched-mode power converters, for which reason said at least one remaining current measuring resistor is also referred to hereinafter as "parallel current measuring resistor". The filter capacitor connected in parallel therewith is the average value capacitor already mentioned in the introduction.

For tolerance, noise or power reasons, both the serial current measuring resistor and the parallel current measuring resistor can each in turn be constructed from a plurality of individual resistors, which can be connected in series with one another or in parallel with one another or in arbitrary combinations thereof. The current measuring device for switched-mode power converters includes three nodes, a third node, into which the current to be measured flows, a first node, from which the current to be measured flows and which is often connected to a circuit ground, and a second node, to which both independent current measuring resistors are connected. Between the first and second nodes there lies a purely resistive branch, the value of which corresponds to a first current measuring resistor. Between the second and third nodes there lies in turn a purely resistive branch, the value of which corresponds to a second current measuring resistor.

A first end of the average value capacitor is additionally connected to the second node. The second end of the average value capacitor is connected either to the first node or to the third node. The total resistance of all those individual resistors which are directly or indirectly connected to the second node and simultaneously have the average value capacitor directly or indirectly connected in parallel with them corresponds to the parallel current measuring resistor; the total resistance of all remaining individual resistors of the current measuring device under consideration corresponds to the serial current measuring resistor.

For the same reasons, the average value capacitor can also be composed of a parallel circuit formed by a plurality of individual capacitors, which can also have different designs, which indicates a further reason for this. By way of example, an electrolytic capacitor and a ceramic capacitor can be connected in parallel, or a film capacitor and a ceramic capacitor: the latter supplies the speed, the former the capacitance. On account of the maximum voltages of less than 5 V that occur there, series connections of capacitors are ruled out.

The current measuring device for switched-mode power converters thus includes two mutually independent sensors connected in series, a conductance of the serial current measuring resistor and an admittance resulting from the parallel connection of average value capacitor and parallel current measuring resistor.

If the second end of the average value capacitor is connected to the first node, the admittance lies between first and second nodes, thus the first current measuring resistor has the function of the parallel current measuring resistor, and the second current measuring resistor has the function of the serial current measuring resistor or that of the conductance. However, if said second end is connected to the third node, the functions are interchanged, such that the first current measuring resistor forms the serial current measuring resistor or the conductance and the second current measuring resistor as parallel current measuring resistor contributes to the admittance, the susceptance of which is formed by the average value capacitor.

This current measuring device exploits the fact that the average value capacitor carries without losses a large portion of the AC current component of the current to be measured and in the process is charged to a voltage which, proceeding from smaller values, comes close to the actual average value over time of the current to be measured and hereinafter is called "measured average value". Upon close examination, this measured average value corresponds to the low-pass-filtered instantaneous value of the current to be measured with a time constant which corresponds to that of the admittance and is to be determined even more accurately further below. In addition to approaching from below an actual average value over time of the current to be measured, the measured average value always also has a ripple in the clock frequency of the power converter under consideration. It follows from this that the measured average value may at times also lie above the actual average value over time of the current to be measured. However, the theoretical median of the measured average value always lies below the actual average value, except if the average value capacitor were infinite in magnitude. All this also holds true if the current to be measured is negative in portions. As long as its measured average value is positive, which is almost always the case when active power is transferred from the input to the output of the power converter, negative measurement signals are avoided as a result of this averaging. Conversely, the sign of said measured average value indicates the direction of the power flow. This average value capacitor newly lying in the power path, besides the separation of the current measuring resistor by the second node, is the central element of the current measuring device for switched-mode electronic power converters, as can also be inferred from the designation of the two current measuring resistors connected to it. The current to be measured is advantageously the operating current of an actively controllable power transistor within an electronic power converter under consideration or generally a current in a branch of the power converter topology, which current is chopped or may be negative in portions and therefore contains high AC current components because the electronic power converter under consideration is operated in a switched-mode manner. According to the at least one exemplary embodiment of the present disclosure, the root mean square value of the current to be measured is at least 1.4 times the magnitude of its average value over time. The latter value is exactly what the specified current measuring device is intended to determine, which is why said value is present. This is reliably the case for a current whose root mean square value maximally corresponds to 8 times its average value over time. The higher this relative root mean square value, the more exactly, even, the specified current measuring device operates, even if its actual purpose—precisely that of determining the average value of a current over time—may be lost in the process. In that case, instead, it is possible to determine a DC error in an actually pure AC current, and the exact time profile of the pure AC current component can be measured in the case of a displacement of the ground point.

A further advantage of the current measuring device for power converters is the possibility of being able to offer simultaneously two measurement signals which, although correlated with one another, are nevertheless different.

If the average value capacitor is connected to the first node, it is possible to tap off the measured average value from the current measuring device for switched-mode power converters directly in parallel with its admittance between the second and first nodes as a first measurement voltage. Between the third and first nodes of such an arrangement, the sum of the measured average value and a measurement value for the instantaneous value of the current to be measured can be tapped off as a third measurement voltage.

However, if the average value capacitor is connected to the third node, the measurement voltage for the measured average value is in turn present in parallel with the admittance, i.e. accordingly between the third and second nodes. Across the conductance between the second and first nodes of such an arrangement, a measurement value for the instantaneous value of the current to be measured can be tapped off as a second measurement voltage. Between the third and first nodes, once again the sum of the measured average value and the measurement value for the instantaneous value of the current to be measured can be tapped off as a third measurement voltage.

Therefore, the third node is also referred to as summation point, and the first node can be connected to a circuit ground. The often sought peak value of the current to be measured can be identified either from the measurement value for the instantaneous value or from the summed measurement voltage.

As already up until now, in the following description the currents which, for identifying the measurement voltages, ultimately flow into the function blocks which are disposed downstream of the disclosed current measuring device for switched-mode power converters and are deemed part of the regulation circuit for the same power converter, in total flow out thereof again in the direction of the circuit ground and are tiny (e.g. one thousandth or less) compared with the current to be measured will not be taken into account any further, in principle.

The time constant of the admittance should advantageously produce double the cut-off frequency—already mentioned above—of the entire power converter in order that evident changes in the average value of the current to be measured can still be correctly represented by the measured average value, i.e. by the low-pass-filtered value of its instantaneous value. Fluctuations in the first measurement voltage across the parallel circuit formed by average value capacitor and parallel current measuring resistor, i.e. fluctuations in the measured average value in parallel with the admittance, given the double value of said cut-off frequency, are intended to be damped by less than 10% by comparison with the actual fluctuations of the average value over time of the current to be measured.

In various embodiments of the present disclosure, the time constant of the admittance can be greater than 0.2 times the greatest occurring period duration of the clocking of the power converter, and the time constant amounts to a maximum of 20 times said period duration. The time constant of the admittance can be greater than 0.6 times the greatest occurring period duration of the clocking of the power converter, and the time constant amounts to a maximum of 5 times said period duration. Owing to the relatively small value of the parallel current measuring resistor, for this purpose the average value capacitor can have a relatively high capacitance, which is advantageous for carrying the AC current component of the current to be measured.

The conductance is not used, in principle, for the calculation of the time constant of the admittance since the current flowing through the serial current measuring resistor, i.e. the current to be measured, always also flows at least proportionately through the at least one storage inductance of the power converter topology, which in each case impresses this current or current portion on account of its significantly higher impedance. In other words, the value of the parallel current measuring resistor remains approximately unchanged if a very large impedance is in turn connected in parallel with it.

Largely, only the DC component or average value of the current to be measured flows through the parallel current measuring resistor and produces there the losses corresponding to said average value, which are significantly lower than the losses corresponding to the root mean square value of the current to be measured, for example by a saving factor of 1.96 to 64. This is because the losses increase with the square of the root mean square value of the current to be measured. The ratio between root mean square value and average value over time of the current to be measured amounts to at least 1.4 in order that reference can be made to appreciable AC current components in the current to be measured. With $(1.4)^2 = 1.96$, this results in the above minimum saving factor for the loss reduction. In a case actually examined, the ratio between root mean square value and average value amounts to 2.36, the square of which results in a saving factor for possible loss reduction of 5.57. Conversely, however, all this also means that an appreciable DC component is present in the current to be measured, since this DC component, as already mentioned in the introduction, can often constitute the most important variable for an evaluation. The current measuring device for switched-mode power converters is thus unsuitable for measuring pure AC currents unless a measuring rectifier is connected upstream of it, through the input of which rectifier the current to be measured flows and to the output of which rectifier said current measuring device is connected. The latter is then suitable for the low-loss determination of a "rectified average value". For a current measuring device without a measuring rectifier, the root mean square value of the current to be measured is intended to amount to not more than 8 times its average value in order still to form a sufficient DC component.

Owing to an AC current component of the current to be measured being carried without losses by the susceptance of the average value capacitor, the current measuring resistor in parallel with the average value capacitor can be embodied with a higher resistance than the current measuring resistor in series with both, i.e. with a higher resistance than the serial current measuring resistor, and it can even have a higher resistance than the individual concentrated current measuring resistor from a known solution. This enables higher average measurement voltages and thus a higher resolution in the function blocks. By somewhat less than the saving factor, that is to say e.g. by a factor of 5 in the examined case, the value of the parallel current measuring resistor can be higher than the value of a concentrated current measuring resistor from the prior art, which in comparison therewith enables a 5-fold finer resolution of this measurement in the function blocks. The remainder up to the saving factor is required for the serial current measuring resistor, i.e. the 0.57. This resistor therefore has approximately half the value of an individual concentrated current measuring resistor from the prior art, or its conductance is approximately double that of a concentrated current measuring resistor.

This is because the information about the time subdivision is supplied by the serial current measuring resistor or the conductance through which the current to be measured flows as a whole. Since the slope with which a given level is reached is usually unimportant (differentiating evaluations are very rare), it can also be smaller than in the case of a known solution with a concentrated current measuring resistor. That enables a serial current measuring resistor which can have a significantly lower resistance than a single concentrated current measuring resistor. Although the losses of this serial current measuring resistor are oriented toward the root mean square value of the current to be measured, in accordance with the low value of this resistor they are smaller than those losses which arise in a known solution with a concentrated current measuring resistor.

The degree of chopping, i.e. the minimum required ripple of the measurement signal for reliable identification and evaluation of the time subdivision in the function blocks, determines the value of the serial current measuring resistor. Its losses are intended to be smaller than the losses allowed for the entire measuring circuit. The difference with respect thereto is utilized by the parallel current measuring resistor, which is connected in parallel with the average value capacitor and the conductance of which results from dividing the square of the averaged maximally occurring measured average value by this loss remainder. The smaller this loss remainder, the greater this conductance becomes, and the smaller the average measurement voltage and thus the possible resolution in the function blocks consequently become. The conflicting parameters "reliability of the identification of the time subdivision" and "resolution of the average values" should be weighed against one another.

In this case, it is advantageous if the conductance of the admittance is related to a nominal output power Pnom of the switched-mode electronic power converter and corresponds to a resistance of between 40 $V^2$/Pnom and 1000 $V^2$/Pnom. In one example the conductance of the admittance corresponds to a resistance which is related to a nominal output power Pnom of the switched-mode power converter and produces an ohmic value of between 80 $V^2$/Pnom and 400 $V^2$/Pnom. In another example, the conductance of the admittance corresponds to a resistance which is related to a nominal output power Pnom of the switched-mode power converter and produces an ohmic value of between 80 $V^2$/Pnom and 400 $V^2$/Pnom, and the capacitance of the average value capacitor is likewise related to the nominal output power Pnom and amounts to from Pnom*25 ns/$V^2$ to Pnom*500 ns/$V^2$.

In one embodiment, in this case, the total conductance value of the conductance is 2 to 100 times, in particular 5 to 40 times, and particularly advantageously 10 to 25 times, higher than the conductance of the admittance.

The more accurately the possible forms and value ranges of the current to be measured and the more accurately the purposes of the measured signals are known, the further the minimization of the measurement losses can be driven, which is encompassed in particular in the following further description, the figures and the dependent claims. It is found that the conductance can be five to twenty times higher than the conductance of the parallel current measuring resistor.

Both, i.e. form and purpose, are closely linked with the power converter topology provided, for which reason two of them are used hereinafter in representative fashion as examples for the application of the current measuring device for switched-mode power converters: the isolating buck-boost converter or flyback converter and the half-bridge. The time subdivision is less important for the latter than for the flyback, which often at the same time is also intended to operate as a power factor corrector. Since precisely such circuits almost always operate in the so-called "critical conduction mode (CRM)" or "transient conduction mode (TCM)" or "valley detect mode", the current to be measured is that current through the power transistor which has a substantially triangular waveform during a switch-on time. The wholly crucial peak value of this current should be identified reliably once per period duration of the clocking of such a power converter, and the power transistor should thereupon be switched off each time. In the case of a half-bridge, by contrast, the information about a time subdivision serves principally for an overcurrent identification in at least one of the power transistors, whereupon the entire half-bridge should be momentarily turned off or at least regulated for reduction. Such overcurrents may occur e.g. in the case of a short circuit on the output side, when the power supply system voltage is switched on, or in the case of voltage pulses on the power supply system line. Whether an overcurrent shutdown takes place immediately or not until half a period duration later can be less important on account of an internal inertia of half-bridges, which are usually operated resonantly and thus in a type of "continuous conduction mode (CCM)". In this case, "continuous" should be understood as continuous not in the sense of uniform or "with a high DC current component", but rather in the sense of "non-intermittent".

Since a peak value of the current to be measured in half-bridges is always at least of the same order of magnitude as the associated average value, the measured average value can be forwarded as a first measurement voltage without correction to the function blocks, and the measurement value for the instantaneous value added to it can be used independently thereof as a third measurement voltage for all types of safety shutdowns. For this purpose, the second end of the average value capacitor is advantageously connected to the first node.

The actual average value over time of the current to be measured is—except if the admittance has a time constant of infinite magnitude, which however already had to be excluded above—on average always higher than the measured average value which is able to be tapped off as first measurement voltage at the second node and which corresponds to a low-pass-filtered signal of the instantaneous value of the same current. In order, from this value, to arrive at the actual and higher average value, the average value over time of the measurement signal of the instantaneous value across the conductance is added thereto and this sum is again low-pass-filtered or averaged. The actual average value thus corresponds to the sum of measured average value and measured instantaneous value, both together in turn averaged. The circuitry counterpart thereof, which also further increases the signal-to-noise ratio in the function blocks owing to the higher absolute measurement values, is the tapping only of the third measurement voltage at the summation point or at the third node, which voltage is forwarded unchanged or via a so-called "fast tracking filter" to a second input of the second function block for the safety devices and, in parallel therewith, is forwarded via a very slow measurement low-pass filter, which hereinafter is also called "slow tracking filter", to a first input of the first function block for the current regulation. In order that the currents flowing through such tracking filters and ultimately into the function blocks remain negligible, the slow tracking filter and also the fast tracking filter can be dimensioned once again in traditional fashion with high resistance.

Without a parallel forwarding of the third measurement voltage via a slow tracking filter, simpler evaluation circuits in particular in the form of prefabricated power converter drive ICs can also be coupled to a current measuring device specified.

Said drive ICs almost always have only one input for the measurement value of the current to be measured, which is usually the power transistor current. Said one input is thus particularly advantageously connected to the third node or to the summation point. This is because such drive ICs require the information both about the time subdivision and about the average value. Since the scaling of average value and instantaneous value is usually different, however, in the current measuring device for switched-mode power converters, in particular the scaling of the average value is increased in comparison with that of the instantaneous value, proceeding from the first measurement voltage at the low-resistance second node, i.e. proceeding from the previously unused measured average value, for at least one target value for the drive IC to be influenced in a corrective manner. If said target value is not passed toward the outside or to be predefined from the outside by way of connection to the drive IC, but rather is formed by an internal reference as usual, the application of the specified current measuring device in conjunction with such simple drive ICs prefabricated for switched-mode power converters is ruled out. Therefore, this possibility will not be considered further.

Measurement low-pass filters or generally tracking filters can likewise be applied expediently for the separate evaluation of the two signals at the current measuring device for switched-mode power converters and for example particularly advantageously for a half-bridge. In this case, the first measurement voltage, i.e. the measured average value, can be passed on via a slow tracking filter in the form of a low-pass filter to the first input of the first function block, which further smooths the first measurement voltage with a time constant which corresponds at least to that of the admittance, i.e. that of the parallel circuit formed by average value capacitor and parallel current measuring resistor, or else can be up to 50 times or even up to 500 times greater than that of the admittance. Alternatively, said slow tracking filter is dimensioned such that at least 90% of all voltage fluctuations with frequencies above 20 kHz are suppressed at its output. Moreover, the measurement value—added to the measured average value—for the instantaneous value of the power transistor current, i.e. the third measurement voltage, from which at least one peak value can be determined, is passed on via a fast tracking filter to the second input of the second function block. Said fast tracking filter can be a direct connection or a simple series resistor for the purpose of impedance matching toward the function block, which together with an input capacitance of the second input acts as a very fast low-pass filter. However, it can also be a complete fast low-pass filter. Alternatively, the fast tracking filter can be a bandpass filter in order to forward error-typical signals to the function block, or finally it can be a band-stop filter in order to prevent incorrect triggerings of safety shutdowns. The output of the slow tracking filter can in turn be connected via a series resistor to the first input of the first function block provided therefor.

In the case of application of the current measuring device for switched-mode power converters in flyback topologies or, in more general terms, whenever the power converter, at the same time as its power conversion and transfer, is also intended to operate as a power factor corrector, the information about the time subdivision can become so important that not only should any tracking filters be matched, but it is even possible particularly advantageously to interchange the functional sequence of admittance and conductance in the current measuring device. This is because then it is more expedient to have available, instead of a pure average value signal in the form of the measured average value, a pure instantaneous value signal which can be tapped off in the form of a second measurement voltage as a measurement value for the instantaneous value of the current to be measured at the second node, in parallel with the conductance of the current measuring device. The second measurement voltage also contains the peak value usually sought. For this purpose, the second end of the average value capacitor is connected to the third node. The serial current measuring resistor or the conductance is then formed by the first current measuring resistor and its first end is particularly advantageously connected to circuit ground or connected to the first node, and its second end marks the second node shared by the parallel current measuring resistor, which is then formed by the second current measuring resistor, and the average value capacitor. The sum of the measurement values of average value and instantaneous value, as above in the case of the half-bridge, can be tapped off as a third measurement voltage at a summation point or third node, which is connected e.g. to the reference electrode of a power transistor whose operating current is intended to be measured.

Therefore, the slow tracking filter for the measurement value of the average value here is connected to the summation point, i.e. to the third node, and the fast tracking filter here is connected to the second node between conductance and admittance. In this case, both filters can be embodied as above for a half-bridge. Here, a bandpass filter fosters a correct time control, and a band-stop filter avoids control errors such as e.g. jitter. Since only the time subdivision is to be evaluated at the second input of the second function block provided therefor, the reduced amplitude of the peak value signal determined from the instantaneous value measurements does not bring about a disadvantage in comparison with the known solution with a concentrated current measuring resistor.

The problem addressed with regard to the regulation circuit is solved by means of a regulation circuit configured for a current measuring device, including
  a first function block for realizing a current regulation of a regulated power supply, said first function block using the first or the third measurement voltage as input signal representing the present current,
  a second function block for realizing an overcurrent shutdown of the regulated power supply, said second function block using the second or the third measurement voltage as input signal representing the present current,
furthermore including a matching network, which can include a first and/or a second tracking filter, the matching network being connected between the measurement voltages and the function blocks. The different filtering of both measurement voltages advantageously affords advantages in the evaluation in the regulation circuit, such that the latter can operate very efficiently.

In one exemplary embodiment of the present disclosure, the first tracking filter is a low-pass filter and has a time constant which amounts to 0.01 times to 100 times the time constant of the admittance. A sufficient smoothing of the signal is advantageously achieved by means of this design.

In one embodiment, the second tracking filter consists of a direct connection or of a series resistance between the current measuring device and the second input of the second function block, without having a connection to the reference potential.

This advantageously ensures a very simple, cost-effective and effective measurement of an instantaneous value.

In another embodiment, the second tracking filter is a low-pass filter having a time constant of between 10 ns and 100 μs, particularly advantageously a time constant of between 100 ns and 10 μs, the second tracking filter having a connection to the reference potential. The smoothing of the low-pass filter produces a more continuous measurement signal, which can be evaluated more simply.

In yet another exemplary embodiment of the present disclosure, the second tracking filter includes or consists of a bandpass filter in order to forward error-typical signals to the function blocks or to foster the correct time control. In a further embodiment of the present disclosure, the second tracking filter includes or consists of a band-stop filter in order to prevent incorrect triggering of safety shutdowns or to prevent jitter.

Exemplary embodiments can be found in the dependent claims and the entire disclosure, a distinction not always being drawn in specific detail between device and use aspects in the explanations; the disclosure should be read in any case implicitly with regard to all claim categories.

Further advantageous developments and configurations of current measuring devices for switched-mode electronic power converters can be found from further dependent claims and from the following description.

BRIEF DESCRIPTION OF THE DRAWINGS

Further advantages, features and details of the present disclosure are evident with reference to the following description of exemplary embodiments and also with reference to the drawings, in which identical or functionally identical elements are provided with identical reference signs. Exemplary embodiments and drawings are only of exemplary character in each case and therefore do not restrict the scope of protection to their direct content. In the figures here:

FIG. 1 shows the basic structure of a regulated electronic device, including a switched-mode power converter, with a regulation circuit, which in turn includes two function blocks, FIG. 2A-2F show various possible realizations of the current measuring device for switched-mode power converters.

DESCRIPTION

Figure 2F:
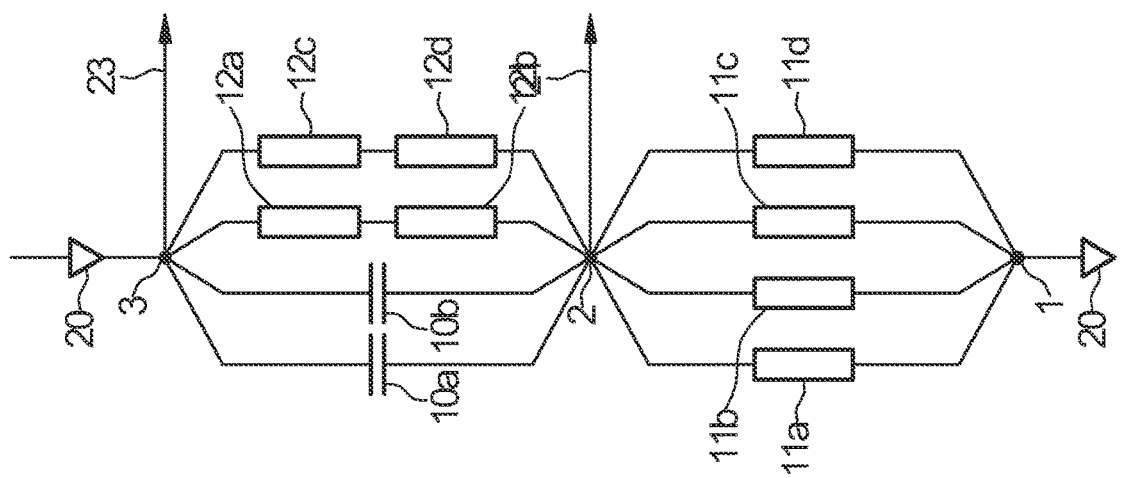

FIG. 1 illustrates the basic structure of a regulated power supply 700, which can likewise be a plug-in power supply unit as a very simple power supply, a switched-mode power supply, a laboratory power supply, a DC converter, a DC-DC converter, an active current source, an active voltage source or an operating device for light sources, such as for light emitting diodes. It includes a power section 600 having at least one switched-mode electronic power converter, which includes at least one storage capacitor and at least one storage inductance or storage coil or storage inductor and also at least one rectifier diode and at least one actively controllable power transistor; this has already outlined the three simplest power converter topologies of buck converter, boost converter and buck-boost (or flyback) converter. The latter requires two storage capacitors. If two storage inductances are acquired instead, which can also be coupled, and if the now once again one storage capacitor ends up between power transistor and rectifier diode, a Čuk converter can be designed therefrom. Proceeding from the Čuk converter, the Zeta converter and SEPIC (single-ended primary inductor converter) additionally require a second storage capacitor, the Zeta converter at its input and the SEPIC at its output. If two actively controllable power transistors are used in the same power converter topology, there arise in particular the so-called half-bridge converters, which require at least one further storage capacitor in series with the storage inductance besides at least one additional rectifier diode, said at least one further storage capacitor taking up the DC voltage component of the half-bridge output voltage. If this series capacitor together with the storage inductance, which in the case of half-bridges is advantageously realized at least partly by a transformer, forms a resonant circuit with a natural frequency just below a lowest clock frequency, this gives rise to a resonant LLC converter with a ZVS snubber. If a pure resonance capacitor is additionally connected in parallel with said transformer, this results in a so-called resonant LCC converter, given the above setting of its natural frequency likewise with a ZVS snubber. This last means that each switch-on process of a power transistor involved in the switched-mode power converter takes place with zero voltage, whereby any switch-on losses are avoided. Furthermore, the frequency-lowering effect of the purely resistive portion of each load is permitted to be concomitantly utilized to end up below the clock frequency with everything connected to the output of an LLC or LCC converter.

Furthermore, the power section 600 includes a power supply system input 603, 604 for the purpose of feeding in electrical energy, a radio interference suppression filter, a power supply system rectifier, following that almost always a power factor correction stage, which can also be embodied as a charge pump, and which supplies at least one of the power converter topologies above, which operates as an actual switched-mode electronic power converter. Finally, the power section 600 also includes an output for the load, at which output the output voltage and the load current can be output, in some cases also together with measurement inputs from the load back to the power section such as e.g. LEDset®. All of these details are mentioned for the sake of completeness, but may not be necessarily part of embodiments of the present disclosure and are therefore not illustrated within the power section 600.

The current measuring device 100 is connected in series with a branch of the power converter topology within the power section 600 in which a current 20 to be measured having a DC current component and at the same time also a high AC current component flows, such that its root mean square value is at least 1.4 times and at most 8 times the magnitude of its average value. Said current measuring device includes a node 1, usually connected to circuit ground, and current 20 flowing from said node, a central node 2, at which a first measurement voltage 21 or a second measurement voltage 22 can be tapped off, and a third node 3, also called summation point, at which current 20 flows into the current measuring device and a third measurement voltage 23 can be tapped off.

The regulated power supply 700 includes as a second important region the regulation circuit 500, which can in turn consist at least of the components: first function block 205 and also second function block 206 and a clock generator 300. The at least one clock generator 300 generates at least one signal 301, whereby the at least one actively controllable power transistor of the switched-mode power converter in the power section 600 is driven. If signal 301 additionally has to be amplified or processed in some other way before the final driving of the power transistor, the circuit for this is deemed part of the power section 600. Signal 301 often includes at least two channels, one for the power factor correction and at least one further channel for the actual switched-mode power converter. The regulation circuit often has a direct input 203, via which the entire power supply is controllable from outside. It is possible to connect to said input 203 an interface (not illustrated) for abovementioned wired or wireless communication protocols from DALI to Thread, a 1-10V dimmer, a dip switch, etc. for setting a load current or the like. Here, however, the regulation circuit additionally includes in particular a second input 212 at the second function block 206 and a matching network 150 connected between said second input and also a first input 211 of the first function block 205 and the measurement voltages 21, 22, 23 from the current measuring device 100.

Further signals can be transferred directly from the power section 600 to the first function block 205, e.g. signal 601 for the output voltage and/or signal 602 for the input voltage or for the temperature of components which either are temperature-sensitive, such as e.g. electrolytic capacitors, or generate a large amount of heat, such as e.g. inductances, active power transistors or rectifier diodes.

The first function block 205 is coupled with the first input 211 as described above. The second function block 206 is coupled with the second input 212. The first function block realizes a current regulation for the regulated power supply 700. For this purpose, a filtered signal representative of the first measurement voltage 21 or the third measurement voltage 23 is input into the first function block at the input 211. As already described above, the measurement voltages 21, 23 are low-pass-filtered and thus representative of the average value of the current to be measured in the power section 600. This signal is utilized for the regulation of the current that flows through the current measuring device 100. For this purpose, the first function block 205 has a current regulation that is known per se and therefore will not be described in any greater detail here. The first function block outputs to the clock generator 300 an output signal that is representative of the switch-on times and durations of the at least one power transistor in the power section 600. The clock generator 300 generates therefrom a drive signal 301 for the at least one power transistor in the power section 600.

The second function block realizes a fast overcurrent shutdown in order to rapidly turn off and thus protect the at least one power transistor in the case of unforeseen currents. For this purpose, the second function block 206 has the second input 212, and a signal representative of the second measurement voltage 22 or 23 is input there, said signal representing the instantaneous value of the measured current as described above. If said instantaneous value rises above a defined threshold value, then the second function block 206 passes a signal to the clock generator 300, which rapidly turns off the power transistor in order thus to end the overcurrent situation. Since the second function block has to react rapidly in order not to abandon the transistor to destruction, either the signal input into the second input 212 is not filtered at all, or the filter contained in the matching network 150 is very fast in order to filter out only unwanted short voltage spikes.

FIG. 2A shows the first basic structure of a current measuring device for switched-mode power converters. The nodes 1 and 2 are connected via a first current measuring resistor 11, and a second current measuring resistor 12 lies between nodes 2 and 3. The third measurement voltage 23 can be tapped off at node 3 or summation point 3, and the first measurement voltage 21, corresponding to the "measured average value"—already defined above—of the current 20 to be measured, can be tapped off at node 2. This is because in parallel with the first current measuring resistor 11 the average value capacitor 10 is connected between the nodes 1 and 2, such that the admittance arises from this parallel connection and the conductance arises from the second current measuring resistor 12. Thus, here the second current measuring resistor 12 is the serial current measuring resistor, and the first current measuring resistor 11 forms the parallel current measuring resistor.

The second measurement voltage 22 proportional to the instantaneous value of the current 20 is present in parallel with the second current measuring resistor 12 and consequently here cannot be tapped off using simple means since from the standpoint of node 1, said voltage is floating around the measured average value 21.

FIG. 2B illustrates a variant which is obvious on the basis of foreseeable dimensioning and in which a plurality of individual resistors having similar resistances are used for each first and second current measuring resistor in a current measuring device for switched-mode power converters. The first of said current measuring resistors, which as a parallel current measuring resistor contributes to the admittance, consists of a series connection of resistors 11a and 11b between the nodes 1 and 2, and the second current measuring resistor, which as a serial current measuring resistor or as a conductance, as explained above, can have a significantly lower resistance than the first current measuring resistor, consists e.g. of a parallel connection of the three individual resistors 12a . . . 12c.

The measurement voltages 21 and 23 that are able to be tapped off correspond in terms of form and position to those from FIG. 2A.

If a current measuring device in accordance with FIG. 2A or 2B is intended to have lower resistance overall, a circuit as shown in FIG. 2C becomes possible. Its average value capacitor here is composed of at least two parallel-connected individual capacitors 10a and 10b for forming the susceptance for the admittance, and the first current measuring resistor, which is in turn connected in parallel therewith, is composed of the parallel connection of two series connections of the individual resistors 11a+11b and 11c+11d. The two lines respectively therebetween can be interconnected (not illustrated) in order to turn a parallel connection of series connections into an equivalent series connection of parallel connections. The conductance or the serial current measuring resistor or here the second current measuring resistor between the nodes 2 and 3 consists of the direct parallel connection of e.g. four individual resistors 12a ... 12d or more. The low voltages across the individual average value capacitors 10a and 10b make an alternative series connection of individual capacitors pointless.

The measurement voltages 21 and 23 that are able to be tapped off correspond in terms of form and position once again to those from FIG. 2A.

Figure 2E:
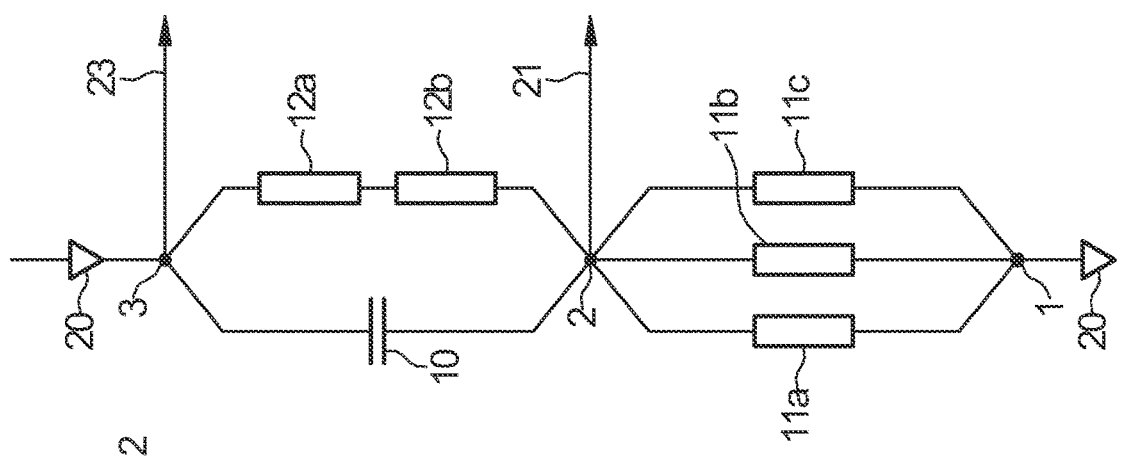
Figure 2D:
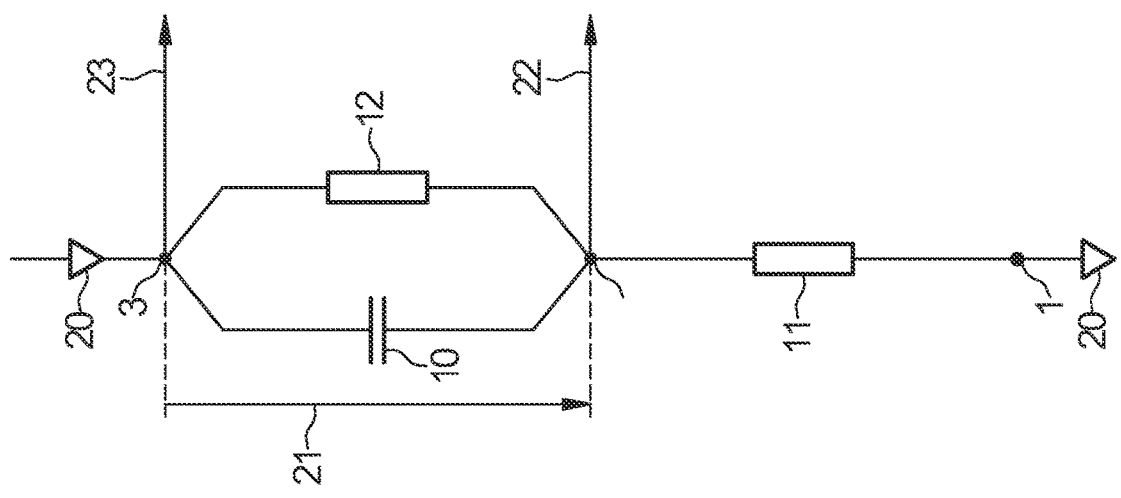

FIG. 2D shows the second basic structure of a current measuring device for switched-mode power converters. The nodes 1 and 2 are connected via a first current measuring resistor 11, and a second current measuring resistor 12 lies between the nodes 2 and 3. As above, the third measurement voltage 23 can be tapped off at node 3 or summation point 3, and in contrast to above, the second measurement voltage 22 with a profile proportional to the instantaneous value of the current 20 to be measured can be tapped off at node 2. Here, in parallel with the second current measuring resistor 12, the average value capacitor 10 is connected between the nodes 2 and 3, such that the admittance arises from this parallel connection, in parallel with which admittance, as explained above, the measured average value 21 is able to be tapped off, which as measurement voltage however is now present between the nodes 2 and 3 and thus "floating". The first current measuring resistor 11 now forms the conductance, which is now connected to node 1 and therefore supplies the "proportional" second measurement voltage 22, which is able to be tapped off at node 2. Therefore, here the first current measuring resistor 11 is the serial current measuring resistor, and the second current measuring resistor 12 as a parallel current measuring resistor contributes to the admittance.

The lower part of this structure in accordance with FIG. 2D from the current 20 to be measured, which leaves this structure, via nodes 2 as far as the second measurement voltage 22 is known from the prior art. In comparison therewith, however, here the conductance of the first current measuring resistor 11 is significantly greater, and produces significantly lower losses but also likewise lower measurement voltage amplitudes of the second measurement voltage 22 than in the prior art. As already explained above, it only has to supply the information about a time subdivision, for which purpose its lower amplitudes are sufficient. Novelty can reside in the admittance as an additional sensor, from the standpoint of the current 20 in series with the lower part:

The measured average value present across that carries, once again with very low losses on account of the average value capacitor 10, 10a, 10b, the main part of the information about the often much more important average value of the current 20. Since, in comparison with the actual average value of the current 20, this measured average value is always too low by a value that lies in the range of the instantaneous value as second measurement voltage 22, the fact that the measured average value 21 is "floating" with the second measurement voltage 22 does not create a disturbance. The third measurement voltage 23 as the sum of measurement voltage 22 for the instantaneous value and measurement voltage 21 for the measured average value, said third measurement voltage being able to be tapped off at the summation point 3, thus carries the information about the actual average value of the current 20 the most accurately.

FIG. 2E illustrates a variant of FIG. 2D which is obvious on the basis of foreseeable dimensioning and in which a plurality of individual resistors having similar resistances are used for each first and second current measuring resistor in a current measuring device for switched-mode power converters. The first of said current measuring resistors, which as a serial current measuring resistor can now have a significantly lower resistance than the second current measuring resistor and forms the conductance, consists of a parallel connection of the three individual resistors 11a ... 11c between the nodes 1 and 2, and the second current measuring resistor, which as parallel current measuring resistor now contributes to the admittance, consists e.g. of a series connection of the resistors 12a and 12b between the nodes 2 and 3.

The measurement voltages 22 and 23 that are able to be tapped off correspond in terms of form and position to those from FIG. 2D.

If a current measuring device in accordance with FIG. 2D or 2E is intended to acquire a lower resistance overall, a circuit as shown in FIG. 2F becomes possible. Its average value capacitor here is composed of at least two parallel-connected individual capacitors 10a and 10b for forming the susceptance for the admittance, and the second current measuring resistor, which is in turn connected in parallel therewith, is composed of the parallel connection of two series connections of the individual resistors 12a+12b and 12c+12d. The conductance or the serial current measuring resistor or here the first current measuring resistor between the nodes 1 and 2 consists of the direct parallel connection of e.g. four individual resistors 11a-11d or more.

The measurement voltages 22 and 23 that are able to be tapped off correspond in terms of form and position once again to those from FIG. 2D.

Figure 3A:
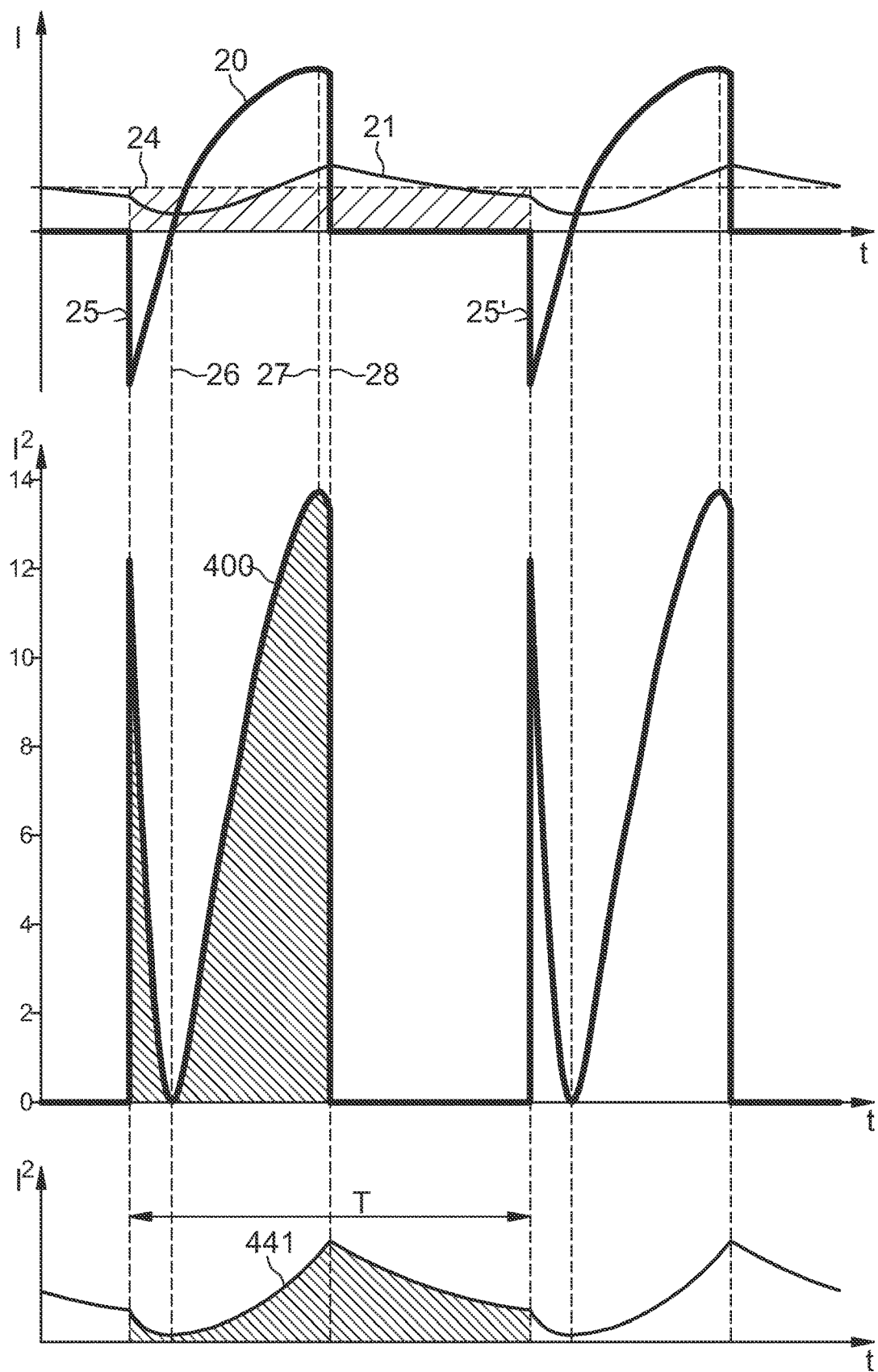
FIG. 3A shows the comparison between instantaneous value, the averaged value thereof, the squared value thereof and the square of the averaged value of a current to be measured for a resonantly loaded bridge branch as a switched-mode power converter.

FIG. 3A shows in its upper graph (current I versus time t) a profile of the current 20 such as is typical of resonant half-bridges as switched-mode power converters. Proceeding from a negative value at the beginning 25 of a conduction phase of the e.g. lower power transistor, current 20 rises rapidly and soon changes its sign at a point in time 26 and is switched off again at a point in time 28 after a sine-like profile at a positive end value of the same conduction phase. Shortly before that at a point in time 27, current 20 often passes through a maximum. This waveform clearly reveals lagging of the current 20, which in principle is a portion of the not yet rectified and smoothed load current or of a part thereof, in relation to the clock frequency of the half-bridge power converter, which lagging originates from the slightly inductive tuning of rectifier and load—once again in relation to the clock frequency—in order to achieve ZVS. ZVS means "Zero Voltage Switching", as a result of which each switch-on process of the at least one switched-mode power transistor is optimally relieved in respect of loading.

The same graph depicts the profile 21 for the measured average value of the current 20 such as was determined in the exemplary embodiment investigated. The scaling of both curves 20 and 21 is the same, which is evident from the already visually readable correctness of the average value. The horizontal 24 corresponds to the actual average value of the current 20. As has already been explained above and as is readily readable here from an area section comparison between the curve 21 and the horizontal 24, the measured average value 21—even if it may be greater in some instantaneous time intervals—is on average always less than the actual average value 24 if the measured average value has a ripple in clock frequency owing to an average value capacitor 10 from one of FIGS. 2A to 2F never being infinite in magnitude. The area sections above the measured average value 21 are larger than those below, which are not hatched in each case. The slightly hatched rectangular area in this graph is proof of the effect desired by exemplary embodiments of the present disclosure.

The middle graph in FIG. 3A illustrates the time profile 400 of the square $I^2$ of the current 20 versus time t, once again with the same scaling as the curves 20 and 21. For the value of the current 20 that determines the losses in current measuring resistors is based on the square of the same current in accordance with the known formula $Pv=R*I^2(t)$, which defines the root mean square value: what constant current brings about the same power loss Pv as an actual time-variable current 20 or I(t) in a resistor having a specific resistance R? This constant—theoretical—current is the root mean square value with respect to the actual current I(t).

However, since this theoretical current is of no interest at all, rather only the power loss caused by an actual time-variable current I(t) or 20, the known formula above already describes the solution: the hatched area enclosed by the time profile 400 and the associated time axis corresponds to the energy which is converted into heat in a resistor having a specific resistance R in a manner caused by the current 20. If this energy is related to the time expended therefor, i.e.—since periodically recurring between the points in time 25 and 25' describing two successive switch-on processes of the same power transistor of the power converter under consideration—expediently the hatched area, lying between the boundary lines 25 and 25' of a period duration T, divided by this period duration, this yields a picture for the power loss that arises in said resistor.

The lower graph in FIG. 3A illustrates the time profile 441 of the square $I^2$ of the measured average value 21 of the current 20. Here, too, the area between it and the associated time axis is hatched in the illustration, and the section thereof between the boundary lines of the same period duration T is a picture for the power loss if only a current corresponding to the measured average value of the actual current I(t) or 20 flows through the same resistor having a specific resistance R. Such a current flows through the parallel current measuring resistor as part of the admittance of a current measuring device specified. The area spanned by the square 441 of this current average value 21 is evidently smaller than the area spanned by the square 400 of the current 20 actually to be measured, even though in the lower graph losses also occur in the time segments in which there are zero pauses in the middle graph.

A small thought experiment serves as clarification: let there be a constant current of magnitude "two". Since it is constant, its root mean square value also has the magnitude "two". However, if the same charge is intended to be transferred with a duty cycle of 50%, i.e. rectangular current blocks are intended to arise which are just as "wide" as the zero pauses therebetween, all the current blocks acquire the magnitude "four". The squaring thereof results in "sixteen". However, since this holds true only with regard to half of all the time segments, the square of the root mean square value results in "eight". This corresponds approximately to the hatched area in the middle graph. The "two" corresponds approximately to the hatched area in the lower graph, from which it follows that this area there is significantly smaller than in the middle graph, even though there are no zero pauses in the lower graph.

The same difference occurs in the measurement losses, either if a resistor is used as a single concentrated current measuring resistor and produces losses in accordance with the middle graph, or if the same resistor contributes as parallel current measuring resistor to an admittance and in this case causes only the much smaller losses in accordance with the lower graph. The square of the root mean square value of the current 20 in a ratio with respect to its average value produces the factor by which the current measuring device specified can maximally reduce the power loss caused thereby. Therefore, this factor is also called a "saving factor".

FIG. 3A is the measurement result underlying aspects of the present disclosure and also the dimensioning of the circuit based thereon, which will be discussed below. The root mean square value of the current 20 to be measured is 2.36 times the magnitude of its average value, which produces a saving factor of 5.57. For a customary power supply with a nominal output power of 40 W, a single concentrated current measuring resistor having a resistance of between 0.1 ohm and 0.5 ohm, particularly advantageously with a resistance of 0.25 ohm, has proved worthwhile. However, if current 20 is intended still to be able to be measured very precisely in the case of very small values, in particular in the case of very small average values, which is indispensable for deep dimming particularly of switched-mode power converters in LED operating devices, the above resistance becomes too low. Simply increasing it leads to unacceptably large measurement losses.

The splitting of said concentrated current measuring resistor into a conductance and an admittance and at the same time the splitting of the evaluation into two independent measurements of average value and time profile of the current 20 allow the required accurate resolution of the average value measurement even with tenable measurement losses owing to the loss-free susceptance of the admittance. In parallel with the admittance there arises a voltage proportional to a low-pass-filtered value of the current 20, the measured average value, if the admittance consisting of the direct parallel connection of the average value capacitor 10 and the parallel current measuring resistor (11 in FIG. 2A-2C or 12 in FIGS. 2D-2F) has a sufficient time constant. The latter is at least 0.2 times the magnitude of the greatest occurring period duration T of the clocking of the electronic power converter 600 equipped with the current measuring device 100 from FIG. 1, which in the case of a resonant half-bridge has the lowest frequency at its nominal power. This is 45 kHz in the example investigated, which results in a greatest period duration T=22.2 µs. The magnitude ratio within the admittance is thus calculated as $$C_{(10)} * R_{(11 \ or \ 12)} > 4.44 \ \mu s.$$

However, the time constant of the admittance can also be significantly greater, e.g. 20 times the magnitude of the greatest period duration above, which represents a maximum. Therefore, the following additionally holds true:

$$C_{(10)} * R_{(11 \ or \ 12)} < 444 \ \mu s.$$

Particularly advantageously, the time constant of the admittance lies in a range of between 0.6 and 5 times the greatest period duration above, for which $$13.3 \ \mu s < C_{(10)} * R_{(11 \ or \ 12)} < 111 \ \mu s$$

holds true.

For the parallel current measuring resistor contributing to the admittance, a resistance of between 1 ohm and 40 ohms has proved worthwhile if the switched-mode power converter equipped therewith has a nominal output power Pnom of 40 W. If the power increases, the resistance decreases accordingly, and vice versa. The general calculation thereof accordingly leads to $$R_{(11\ or\ 12)} = 40\ W * [1\ ohm\ ...\ 25\ ohms]/Pnom =$$
$$40\ V * A * [1\ V/A\ ...\ 25\ V/A]/Pnom = [40\ V^2\ ...\ 1000\ V^2]/Pnom$$

One example of a narrower range results as $$R_{(11\ or\ 12)} = [80\ V^2 ... 400\ V^2]/Pnom.$$

For the average value capacitor 10, the general calculation for the capacitance range results as:

$$C_{(10)} = [25\ ...\ 500] * Pnom * ns/V^2.$$

The investigated exemplary embodiment where Pnom=40 W includes an average value capacitor 10 having a capacitance of 10 µF and a parallel current measuring resistor having a resistance of 5 ohms, i.e. an admittance having a time constant of 50 µs. In general terms, this yields the following for the parallel current measuring resistor:

$$R_{(11\ or\ 12)} = 40\ W * 5\ ohms/Pnom = 200\ V^2/Pnom.$$

Since the average value capacitor has to acquire a capacitance that is all the greater, the higher the nominal output power Pnom of the power converter equipped therewith, the general calculation thereof is reversed to $$C_{(10)} = Pnom * 10\ \mu F/40\ W = Pnom * 10\ (\mu As/V)/(40\ V*A).$$

Since the amperes cancel out, the general calculation for the exemplary capacitance of the average value capacitor 10 results as $$C_{(10)} = 0.25 * Pnom * \mu s/V^2.$$

In the exemplary embodiment, the conductance of the serial current measuring resistor is ten times the conductance of the parallel current measuring resistor, with one hundred times down to double the conductance thereof being possible; in particular cases, the same conductance is also possible. In one example, the conductance of the serial current measuring resistor lies in a range of from twenty times down to five times the value of the parallel current measuring resistor.

The hatched area in the third graph in FIG. 3A, which corresponds to the losses in the parallel current measuring resistor contributing to the admittance, is of approximately the same size as the more slightly hatched area in the first graph in the same figure, which corresponds to the comparable losses if the time constant of the admittance were infinite in magnitude. For said more slightly hatched area is bounded by the actual average value 24 over time of the current 20, which would be conjugate with the measured average value 21 if the average value capacitor 10 from one of FIGS. 2A to 2F had infinite capacitance. The converse of that means that a time constant of the admittance which, as taken as a basis here, amounts to only 50 µs and thus only somewhat more than double the period duration T of the clocking of the half-bridge already comes very close to an ideal state. In the experiment, the more greatly hatched, loss-describing area from the third graph is only 1.013 times the size of the more slightly hatched, idealized area from the first graph. Average value capacitors having a capacitance larger than described above are thus hardly worthwhile, and ones having a smaller capacitance are likewise already expedient.

FIG. 3B illustrates once again with the same scaling as one another the same variables (current I and the square of the current $I^2$ versus time t) distributed among the three graphs in the same way as in FIG. 3A except for the actual average value, only here a synchronously rectified buck converter (synchronous buck) is taken as a basis as switched-mode power converter at an operating point at which its inductor current 20 is negative at times. This operating mode is made possible by the freewheeling diode that is typical of buck converters being replaced with a second actively controllable power transistor, which is normally switched on whenever a simple freewheeling diode would also be in the on state, but which can also remain switched on for longer, as assumed here. It is clearly discernible how the linear rise of the current 20 becomes a parabola 400 having its minimum lying on the time axis at the point in time 26 precisely where current 20 crosses the time axis.

Here, too, the area between the curve profile of 441 and time axis thereof is significantly smaller than the area between the curve profile of 400 and the time axis thereof.

Figure 3B:
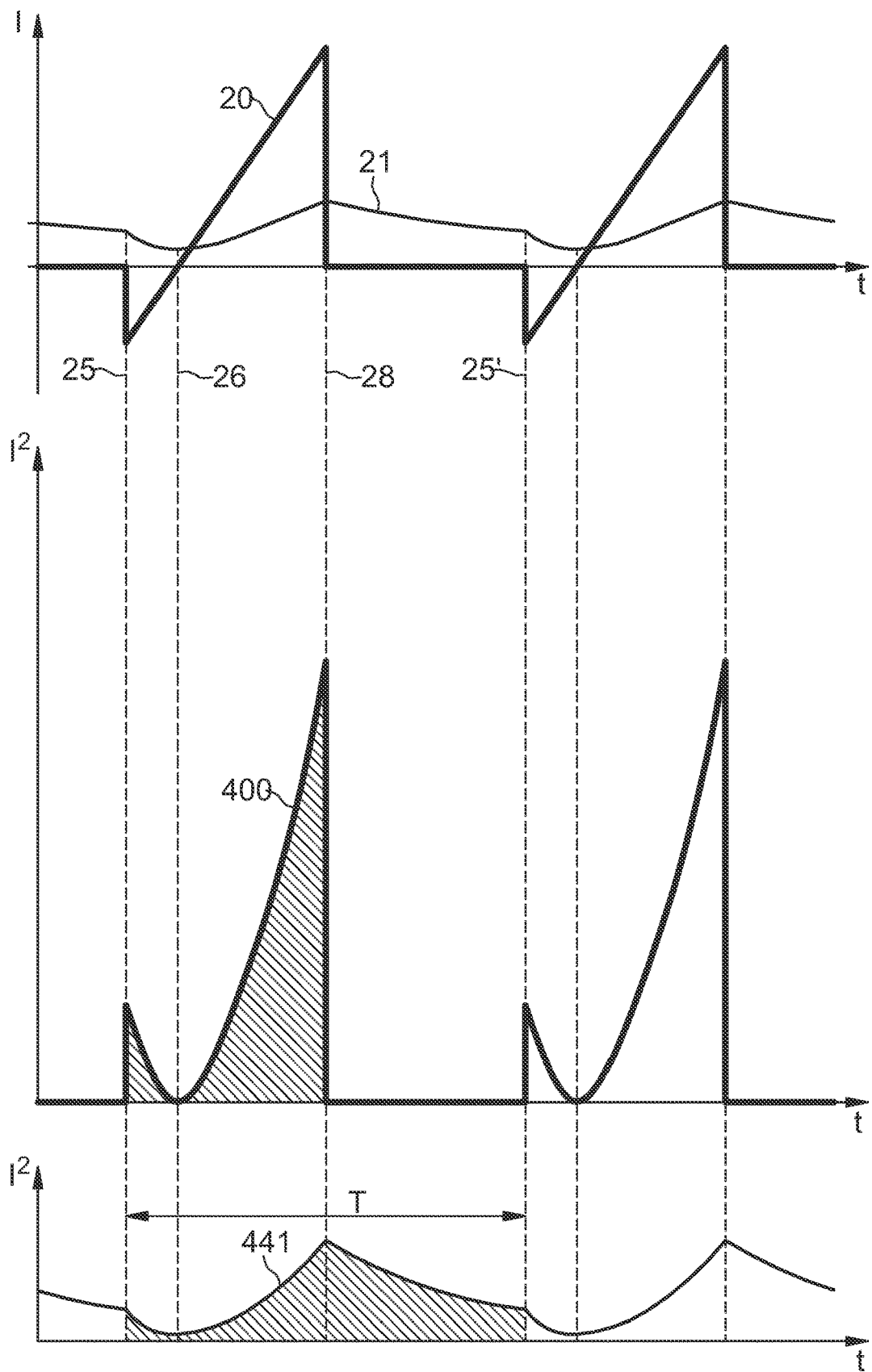
FIG. 3B shows the comparison between instantaneous value, the averaged value thereof, the squared value thereof and the square of the averaged value of a current to be measured for a synchronously operated buck converter as a switched-mode power converter.
Figure 3C:
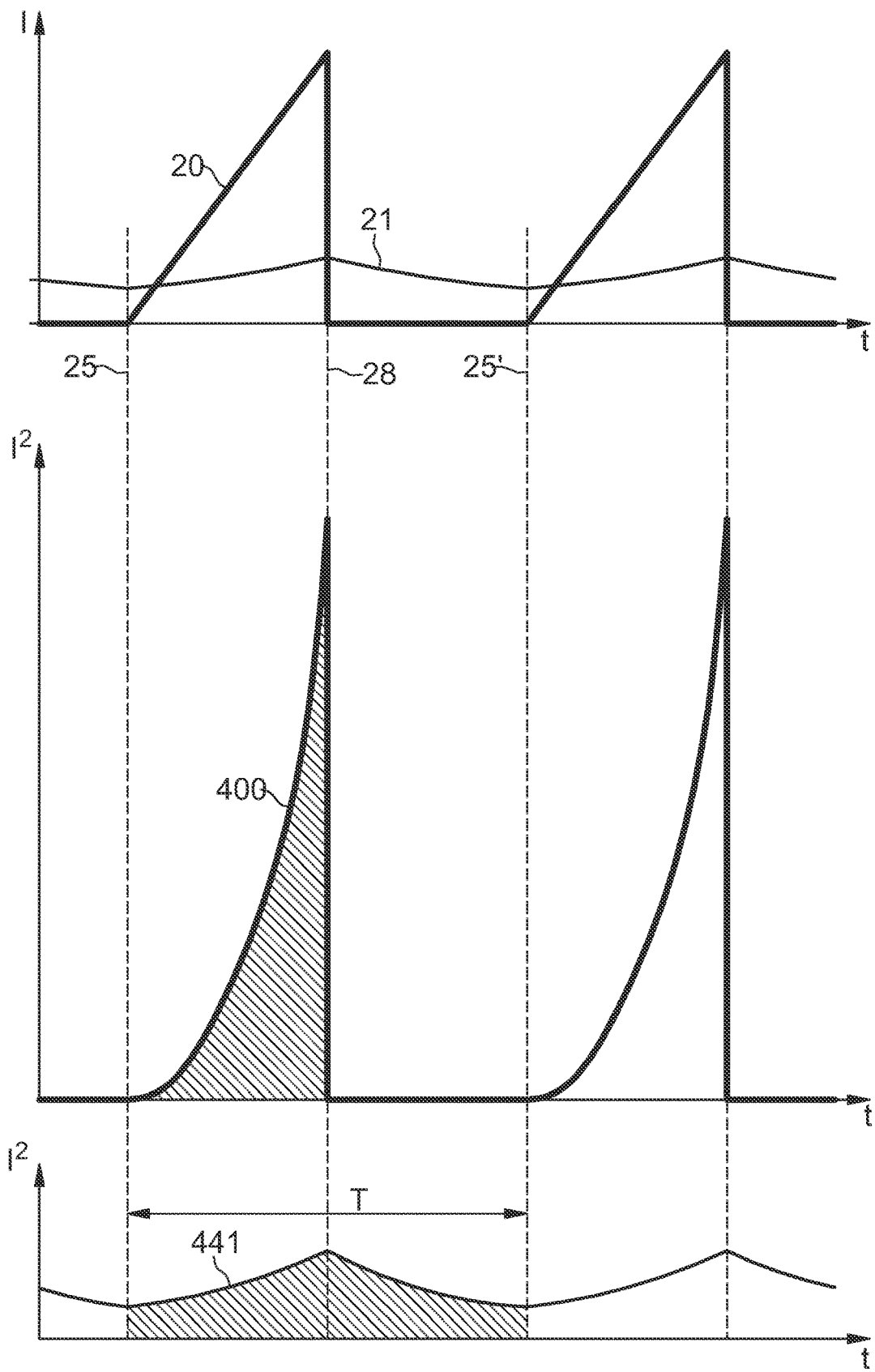
FIG. 3C shows the comparison between instantaneous value, the averaged value thereof, the squared value thereof and the square of the averaged value of a current to be measured for a power factor correcting boost converter or flyback converter as a switched-mode power converter.

FIG. 3C shows the same variables as FIG. 3B, but now for all power converters apart from the forward converter whose converter topologies have only one active power transistor, wherein they are not operated resonantly, but rather actually in a hard switching manner, but in return in the so-called borderline mode or "critical conduction mode" or "transient conduction mode" or "valley detect mode". This operating mode is distinguished by the fact that the current through a converter inductance rises linearly as long as the sole power transistor is switched on, and decreases linearly again as long as said transistor is switched off and consequently—thanks to the converter topology—the rectifier diode is in the on state and passes on the energy stored in the inductance to the converter output. It is only when said rectifier diode begins to turn off again, which can be identified by an abrupt change in voltage across the converter inductance, that the power transistor is switched on the next time at the point in time 25'. This is typical of the above borderline mode, which results in a current with a substantially triangular waveform. FIG. 3C thus holds true e.g. for all boost converters, flyback converters and SEPICs, and even in particular if they operate as power factor correctors.

The area difference between the middle and lower graphs is still evident here, albeit no longer as pronounced as in FIG. 3A or 3B.

Figure 3D:
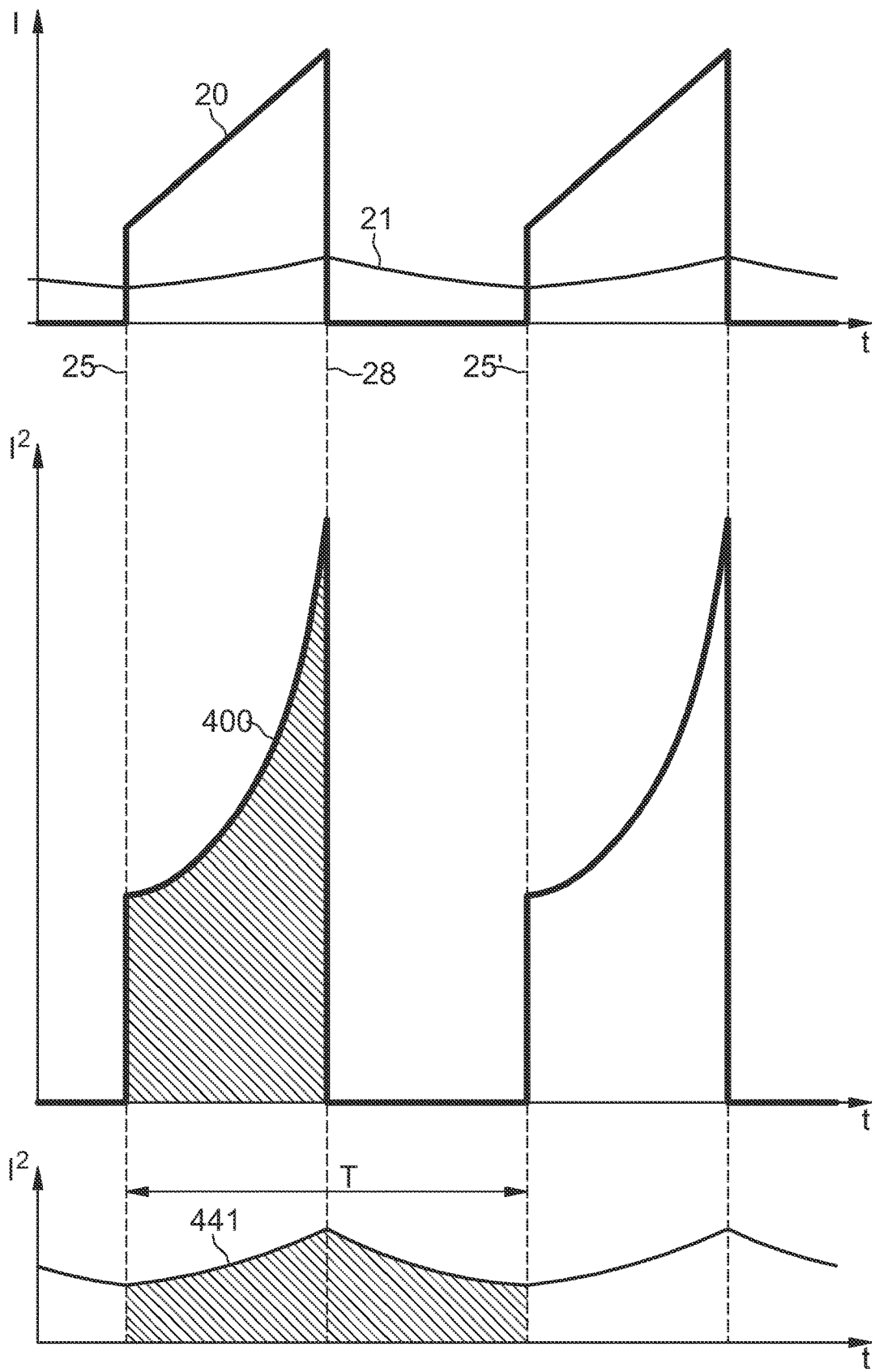
FIG. 3D shows the comparison between instantaneous value, the averaged value thereof, the squared value thereof and the square of the averaged value of a current to be measured for a buck converter operated with non-intermittent current as a switched-mode power converter.

Said area difference is even less pronounced in FIG. 3D, which shows as current 20 the power transistor current of a buck converter with non-intermittent inductor current (CCM buck). Such switched-mode power converters are often used as post-regulators for the loss-minimized compensation of voltage fluctuations. "Non-intermittent" or "CCM=continuous conduction mode" already indicates more highly continuous currents, which results in the area difference between the second and third graphs being less pronounced: root mean square value and average value of the current 20 have come even closer to one another.

Conversely, said area difference is particularly high in FIGS. 3A and 3B because there the current 20 also includes negative portions. The square 400 thereof becomes positive and thus increases the square of the root mean square value, whereas the measured average value 21 of the current 20 is even decreased as a result of the negative portions thereof: the saving factor becomes particularly high as a result.

Figure 4A:
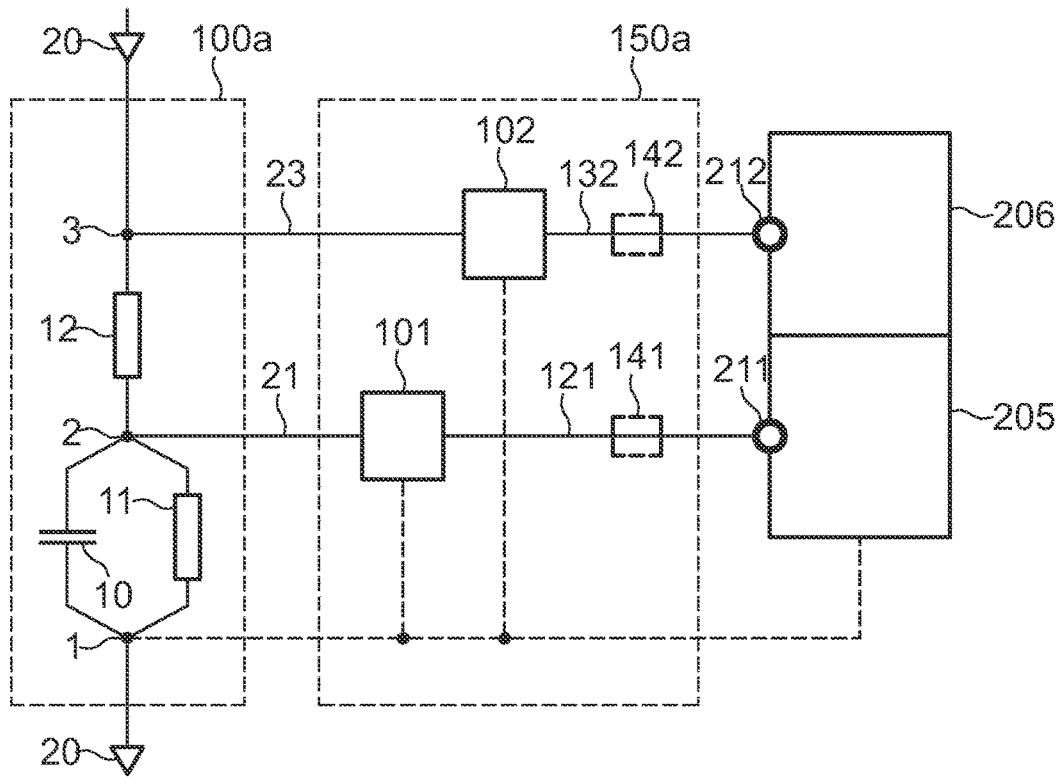
FIG. 4A-4H show various possible configurations of admittance and conductance, of the tracking filters and of the function blocks.

A first possible interconnection of a first basic structure 100a of the current measuring device for switched-mode power converters in accordance with FIG. 2A and a regulation circuit 500 provided therefor is illustrated in FIG. 4A. The matching network 150a to be provided for this includes the first tracking filter 101, which is connected to node 2 and which can also contain a connection to node 1. This is because the first tracking filter, since it is always directly or indirectly coupled in parallel with the admittance of the current measuring device as here, is the so-called "slow tracking filter", i.e. usually a low-pass filter having a time constant which corresponds to at least that of the admittance formed by average value capacitor 10 and first current measuring resistor 11 or which can be 50 times or even 500 times that of the admittance. The current through the connection between node 2 and first tracking filter 101 is generally negligible, as noted above, since in accordance with the traditional rule for measurement filters the input of this first or slow tracking filter 101 is designed with the highest possible resistance. The measurement signal 121 at the output of the first tracking filter 101 is coupled to an input 211 of the first function block 205 directly or via a series resistance 141. Measurement signal 121 here corresponds to a further smoothed profile of the measured average value 21 which, as evident from the profiles 21 of the series of FIG. 3, has in each case a great voltage ripple in the clock frequency of the electronic power converter. Series resistor 141, if no direct connection is present, serves for impedance matching between internal electronics of the first function block 205 and the capacitive output of the first tracking filter 101 as slow tracking filter. In particular, said series resistor in conjunction with an input capacitance of the first input 211 can act as a further, although then fast, low-pass filter and block very high-frequency interference. This is because resistor 141 has a comparatively low resistance, and said input capacitance is small.

In addition to the admittance formed by average value capacitor 10 and first current measuring resistor 11 as first sensor of the current measuring device for switched-mode power converters 100a, in the form of the second current measuring resistor 12 between node 2 and node 3 there is a finite conductance as second sensor of the same current measuring device. The regulation circuit 500 is configured in relation to this second sensor in such a way that its second function block 206 has a second input 212, and that its matching network 150a includes a second tracking filter 102, which can consist of a direct connection between its input and its output or instead of a resistor. Therefore, here and hereinafter the second tracking filter 102 is also called "fast tracking filter". As soon as the second tracking filter 102 becomes more complex, by contrast, it too has a connection to node 1. The second tracking filter 102 can likewise be a low-pass filter, which, however, in contrast to the first tracking filter acting as a slow tracking filter, has a time constant of between 10 ns and 100 µs, particularly advantageously one between 100 ns and 10 µs. By this means, too, the second tracking filter 102 remains a fast tracking filter. Said second or fast tracking filter 102 is connected to node 3, which is also called summation point because the sum of the measurement voltages for the measured average value 21 and for an instantaneous value 22 of the current 20 as third measurement voltage 23 can be tapped off at said node or summation point. The input of said second tracking filter 102, too, following the traditional rule, is once again designed with the highest possible resistance.

Furthermore, the second tracking filter 102 can also be a bandpass filter or a band-stop filter since the third measurement voltage 23, which it converts into a second measurement signal 132, carries the information about the time subdivision, which can be important for switched-mode power converters and from which it is possible to directly derive either drive actions, in particular switch-off times, for the sole power transistor of a simple converter topology or else decisions as to whether a more complex power converter such as e.g. a half-bridge is to be turned off or regulated for reduction. A band-stop filter can filter out interference frequencies that might cause direct drive actions to be subjected to jitter, and a bandpass filter can forward typical frequencies indicating a disturbance which forms a basis for considering shutdown of the power converter, for example, particularly well to the second input 212 of the second function block 206. All these things take place rapidly, which is why the second tracking filter 102 is always a fast tracking filter.

Its output signal or second measurement signal 132, derived from the third measurement voltage 23, is forwarded to either directly or via a second series resistor 142 to the second input 212 of the second function block 206. The task thereof has already been described above in the case of the first tracking filter. In the case of a bandpass filter or band-stop filter, series resistor 142, in a departure therefrom, performs the task of load matching for the second tracking filter 102.

Figure 4B:
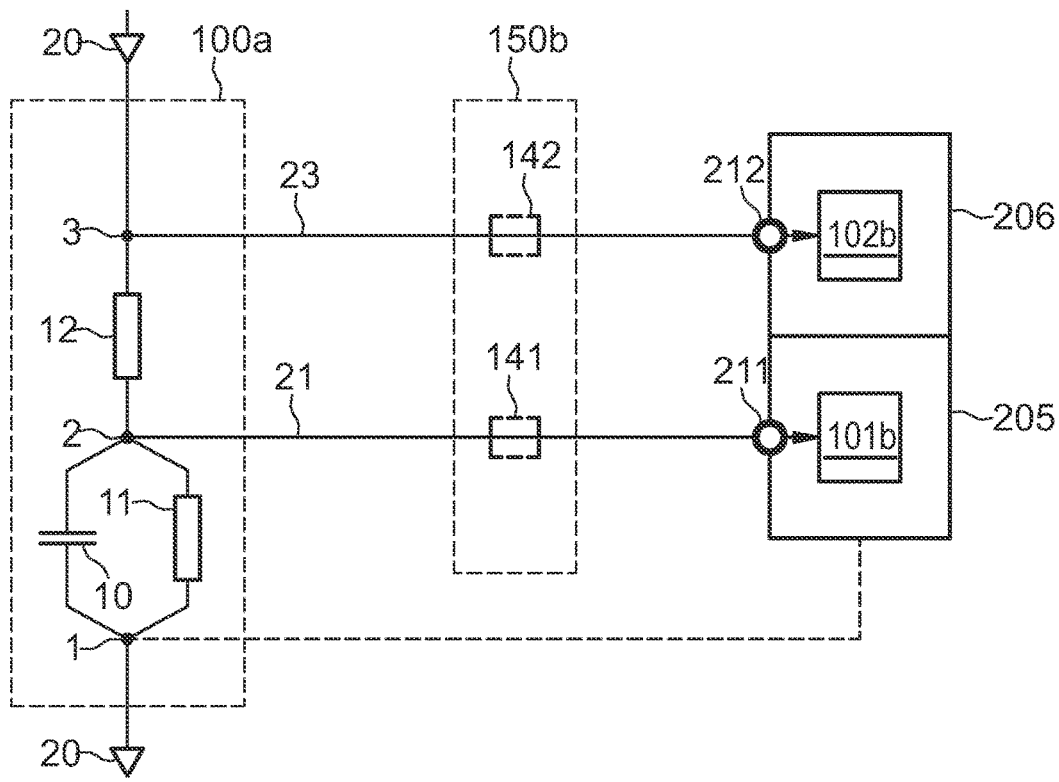

FIG. 4B shows a half- or fully-integrated or -digitized variant of FIG. 4A, for which reason the same current measuring device 100a can be utilized there. Each tracking filter can also be realized by means of FPGA or ASIC or by means of software in a microcontroller or microprocessor. A regulation circuit 500 constructed in this way still has two inputs 211 and 212, to which, in contrast to above, however, the measurement voltages 21 and 23 are connected directly or only via the series resistors 141 and 142, the possible functions of which have already been described above, and which jointly form a matching network 150b appropriate for this. The first input 211 of the first function block 205 now simultaneously forms the input of an "invisible" since integrated or digital first or slow tracking filter 101b, and its second input 212 forms the input of an "invisible" second or fast tracking filter 102b.

Figure 4C:
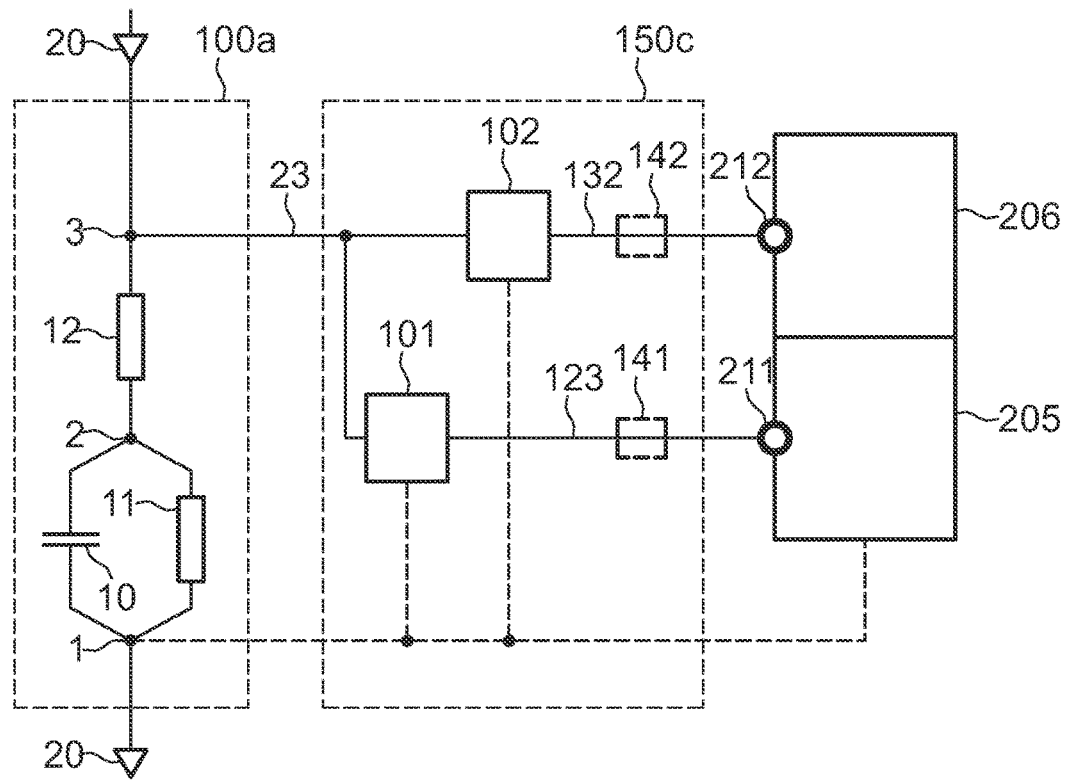

FIG. 4C takes account of the fact described above that the third measurement voltage 23 present at the summation point 3 of a current measuring device 100a for switched-mode power converters, besides information about a time subdivision in the current 20 to be measured, also carries the most accurate information about the average value of the same current 20. This is because the latter is the sum of the measured average value and a measurement value for the instantaneous value, where this sum is in turn to be averaged. Therefore, here, in a departure from FIG. 4A, the first or slow tracking filter 101 is connected to node 3, with the same tasks and dimensioning possibilities as above, thus resulting in the sole difference between this matching network 150c and 150a above. An advantage here in comparison with above is the greater measurement voltage amplitude for the same desired regulation result, whereby the signal-to-noise ratio in the function blocks increases, which is clarified by measurement signal 123 at the output of the first tracking filter 101, which is greater than measurement signal 121 by the averaged instantaneous value of the current 20. The coupling of this higher signal to the first input 211 of the first function block 205, provided as above for tracking filters realized in analog fashion, is effected directly or via the series resistor 141, the possible functions of which have already been described above.

In order to evaluate the information about the time subdivision, here the input of the second or fast tracking filter 102 is simultaneously linked to node 3. Everything else on this "fast" path is identical to that in FIG. 4A.

Figure 4D:
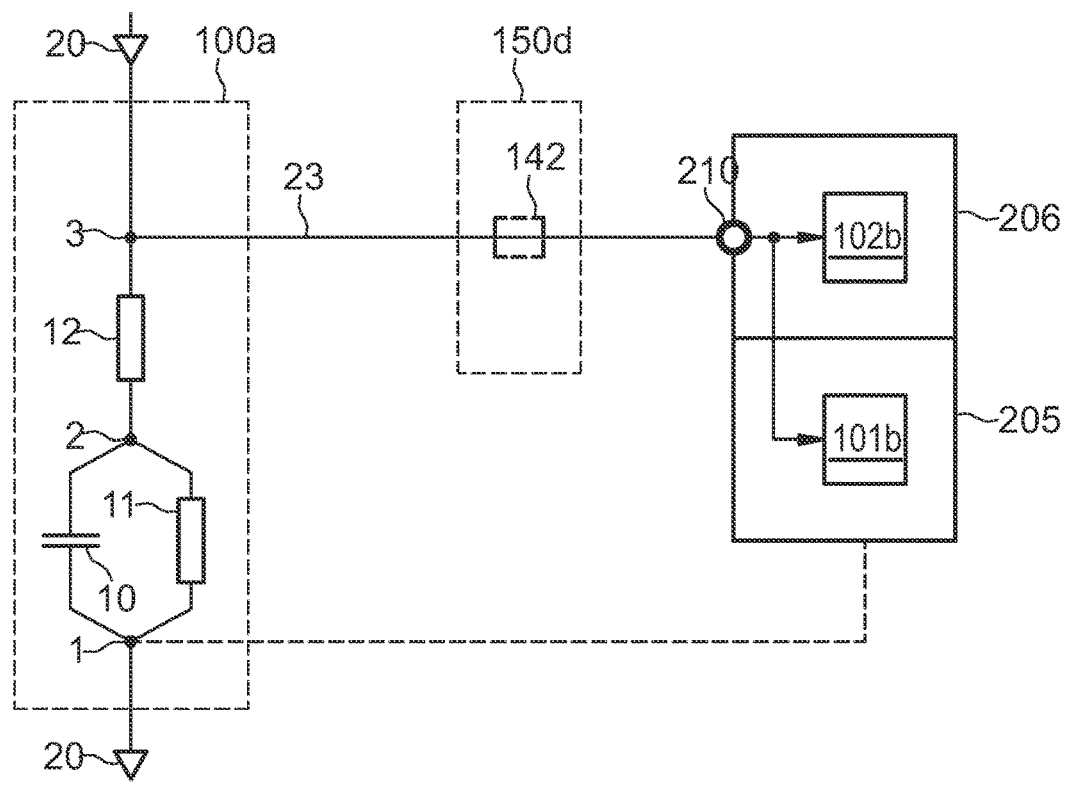

A half- or fully-integrated or -digitized variant of FIG. 4C is shown in FIG. 4D. The now only one connection between node 3 and the sole input 210 of a regulation circuit 500 is effected either directly or via a series resistor 142, which simultaneously constitutes the matching network 150d. Input 210 thus forms the common input of the first or slow tracking filter 101b and the second or fast tracking filter 102b, which can be integrated or programmed into the regulation circuit 500 in just the same way as into function blocks 205 and 206 above, which is why they retain their designation therein. A branching of the inputs of both tracking filters can also be realized by way of FPGA or ASIC or by means of software in a microcontroller or microprocessor.

The following two figures identify functionally identical interconnections between current measuring devices for switched-mode power converters and their evaluation circuits in the function blocks, first with analog tracking filters and then as a half- or fully-integrated or -digitized variant.

Figure 4E:
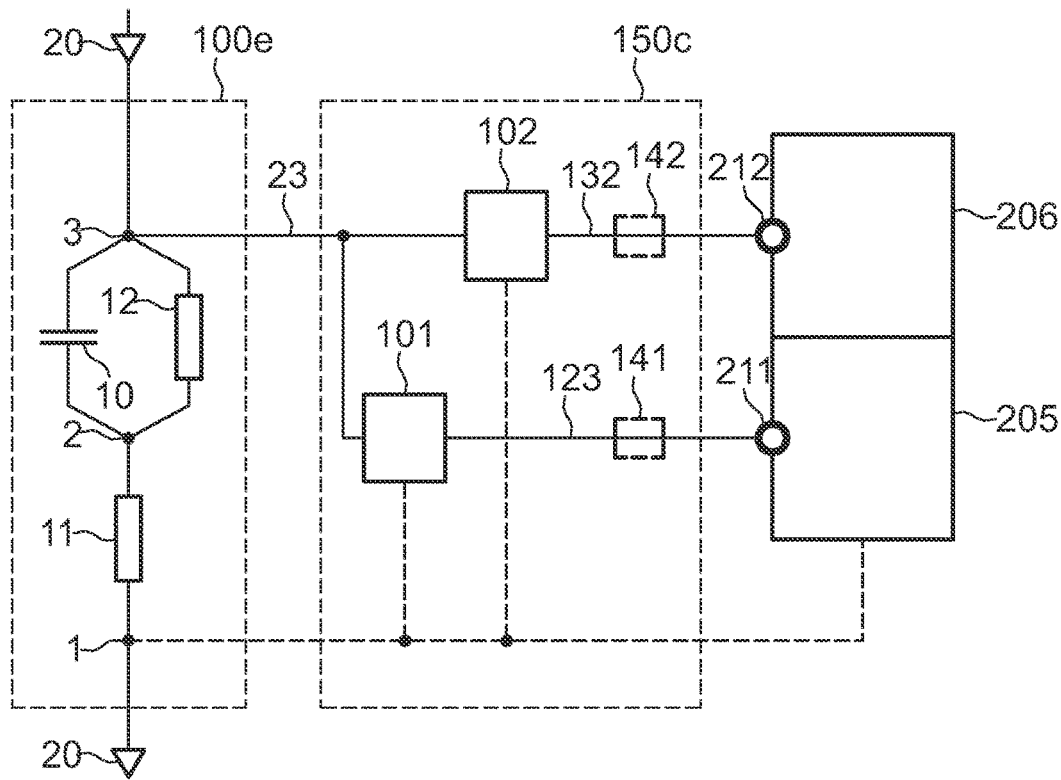

FIG. 4E functionally corresponds to FIG. 4C, except that the order of the sensors in the current measuring device is interchanged, which is unimportant, however, since node 2 is not tapped in both figures. In FIG. 4E, a second basic structure 100e of the current measuring device in accordance with FIG. 2D is connected to the function blocks 205 and 206 via the already described matching network 150c in the same way as in FIG. 4C. Here, however, the conductance between nodes 1 and 2 is formed by the first current measuring resistor 11, and the second current measuring resistor 12 between nodes 2 and 3 contributes to the admittance, the susceptance of which is formed by the average value capacitor 10, which is likewise connected between nodes 2 and 3.

Figure 4F:
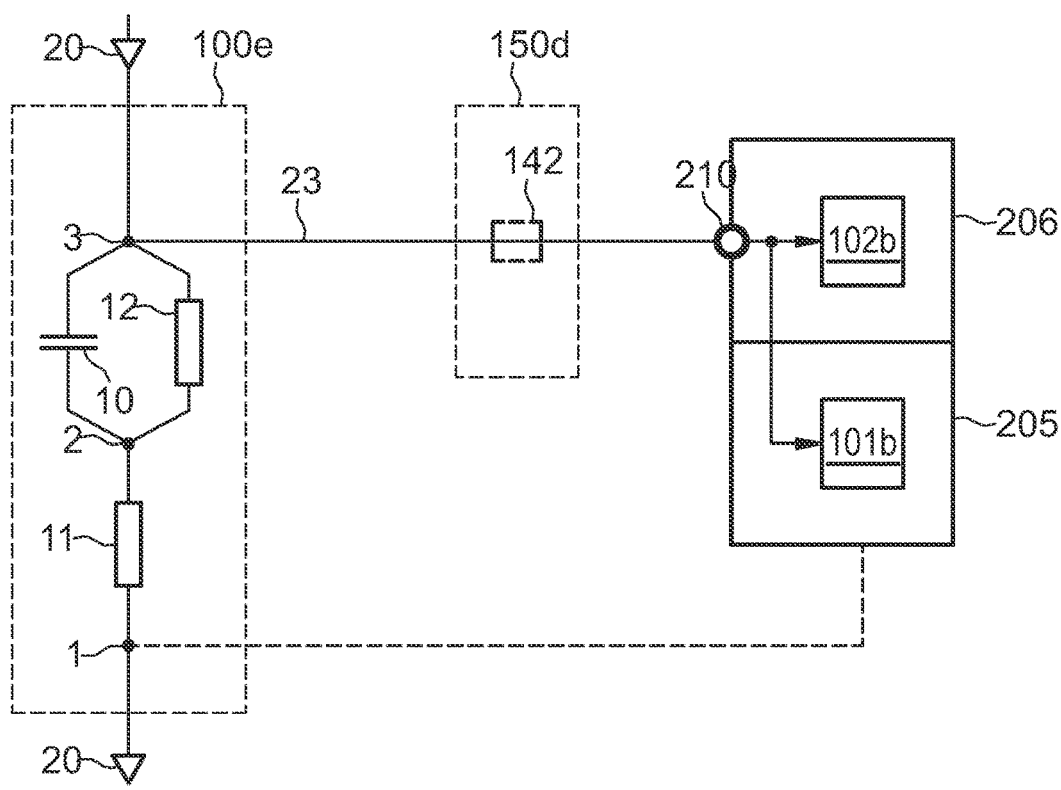

FIG. 4F functionally corresponds to FIG. 4D, except that the order of the sensors conductance and admittance in the current measuring device is interchanged owing to the second basic structure 100e of the current measuring device, but that remains unimportant owing to the unconnected node 2. In FIG. 4F once again a second basic structure 100e of the current measuring device in accordance with FIG. 2D is connected to a half- or fully-integrated or -digitized variant of the regulation circuit 500 in the same way as in FIG. 4D.

Figure 4G:
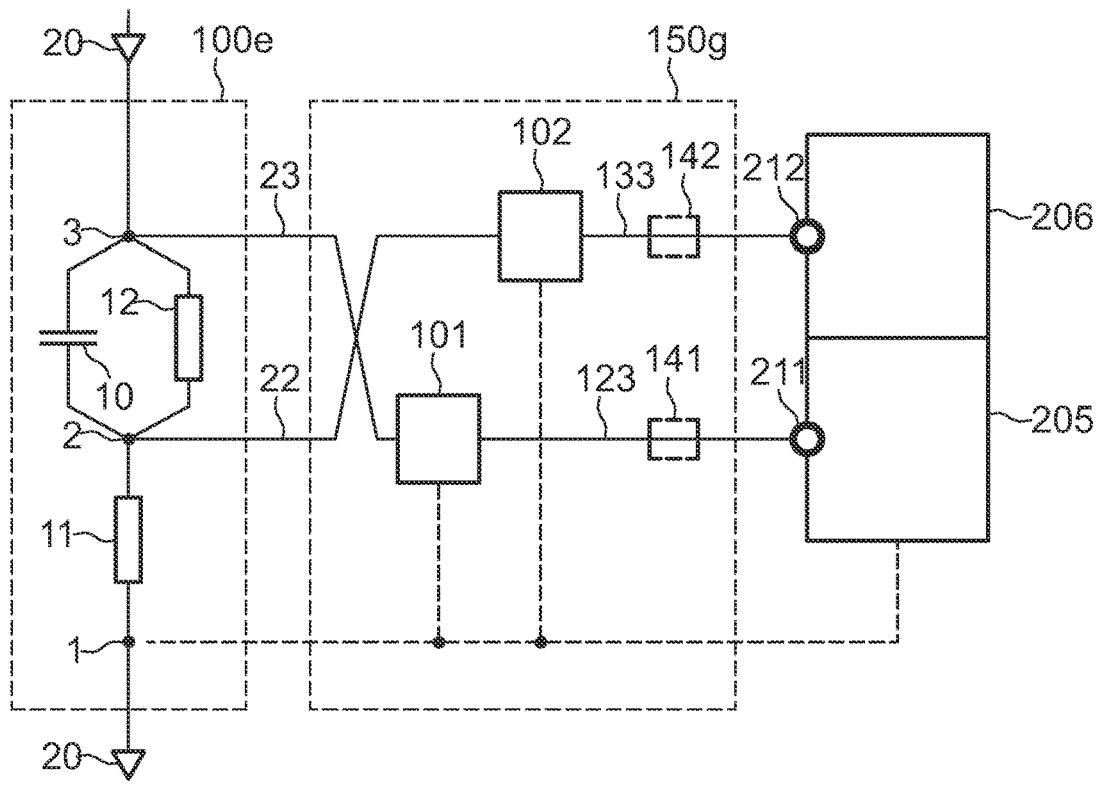

This second basic structure 100e of the current measuring device for switched-mode power converters is connected to the function blocks 205 and 206 via two analog tracking filters for the first time in FIG. 4G. As in FIGS. 4C to 4F, the fact is taken into account here, too, that the third measurement voltage at the summation point 3 carries the most accurate information about the average value of the current 20. For further smoothing the first or slow tracking filter 101 is connected to node 3 in order to provide the third measurement signal 123 therefrom at its output. Said signal is passed on to the first input 211 of the first function block 205 as before directly or via the series resistor 141.

The information about the time subdivision that can be important particularly for power converters operating as power factor correctors is obtained directly from node 2 here via the second or fast tracking filter 102, which here, too, can be dimensioned as described above with regard to FIG. 4A, the second measurement voltage 22 proportionally to the instantaneous value of the current 20 being present at said node 2. This is because the conductance consisting of the first current measuring resistor 11 lies between the nodes 1 and 2 here. From the second measurement voltage 22, the fast tracking filter 102 forms the second measurement signal 133, which as above is forwarded to the second input 212 of the second function block 206 either directly or via the series resistor 142 and which is free of the measured average value 21 in contrast to the second measurement signal 132 from FIG. 4A The sole difference between this matching network 150g and the above matching network 150a from FIG. 4A consists in the crossover of the inputs of first tracking filter 101 and second tracking filter 102.

Figure 4H:
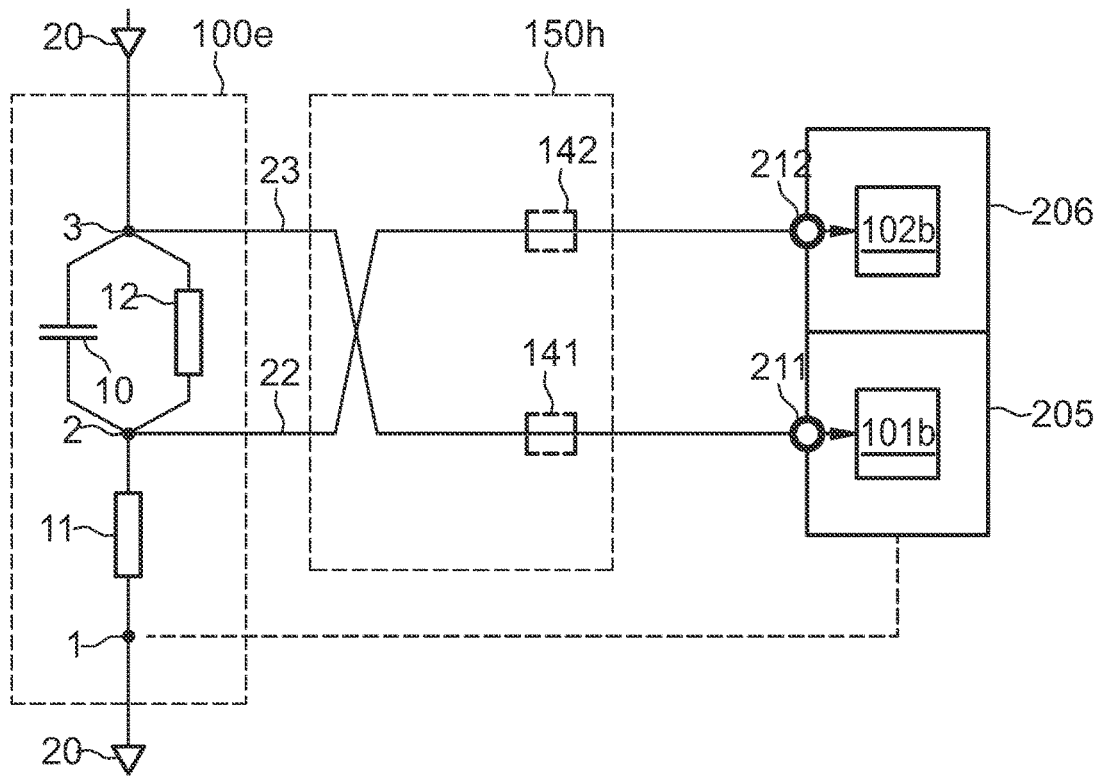

FIG. 4H, finally, shows a half- or fully-integrated or digitized variant of FIG. 4G. For this use is made once again of the function blocks 205 and 206, in which, as described above with regard to FIG. 4B, both tracking filters 101b and 102b can be realized by way of FPGA or ASIC or by means of software in a microcontroller or microprocessor. The function blocks 205 and 206 still have two inputs 211 and 212, the first input 211 as above simultaneously forming the input of the "invisible" first or slow tracking filter 101b and the second input 212 forming the input of the "invisible" second tracking filter 102b. In contrast to above, however, the measurement voltage 23 is connected to the first input 211 directly or via the series resistor 141, and the measurement voltage 22 is connected to the second input 212 directly or via the series resistor 142, which is caused by the crossover of the measurement lines in the matching network 150h.

It will be appreciated that the disclosure is not limited to the disclosed embodiments and to what has been particularly shown and described hereinabove. Rather, features recited in separate dependent claims or in the description may advantageously be combined. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

Furthermore, the scope of the disclosure includes those variations and modifications, which will be apparent to those skilled in the art. The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope. As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner. For the purposes of the present disclosure, the phrase "A and/or B" or "at least one of A and B" means (A), (B), or (A and B). For the purposes of the present disclosure, the phrase at least one of "A, B, and C" means (A), (B), (C), (A and B), (A and C), (B and C), or (A, B, and C).

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

LIST OF REFERENCE SIGNS 1 first node of the current measuring device for switched-mode power converters
2 second node of the same current measuring device third node or summation point of the same current
3 measuring device average value capacitor
10a, 10b individual capacitors which, connected in parallel, form the average value capacitor
11 first current measuring resistor or its resistance
11a . . . 11d individual resistors interconnected to form a first current measuring resistor
12 second current measuring resistor or its resistance
12a . . . 12d individual resistors interconnected to form a second current measuring resistor
20 current to be measured or time profile thereof
400 square of the current 20
21 measured average value or first measurement voltage
441 square of the measured average value 21
22 second measurement voltage proportional to the instantaneous value of the current 20
23 third measurement voltage or sum of first and second measurement voltages
24 actual average value of current 20
100* current measuring device for switched-mode power converters
101* first or slow tracking filter
102* second or fast tracking filter
121, 123 measurement signals as output signals of the first or slow tracking filter
132, 133 measurement signal as output signal of the second or fast tracking filter
141 serial coupling resistor at the output of the first tracking filter
142 serial coupling resistor at the output of the second tracking filter
150* matching network between current measuring device 100 and the function blocks 205 and 206
203 input for external controls
205 first function block for realizing a current regulation
206 second function block for realizing an overcurrent shutdown
210 sole input of the regulation circuit 500
211 first input of a first function block 205 for realizing a current regulation
212 second input of a second function block 206 for realizing an overcurrent shutdown
300 clock generator
301 clock signal
500 regulation circuit
600 power section, including the switched-mode power converter and its current measuring device
601 first further measurement signal from the power section, e.g. its output voltage
602 second further measurement signal from the power section, e.g. its input voltage or its temperature
603 first input for the power supply of the power section 600
604 second input for the power supply of the power section 600
700 regulated power supply

The invention claimed is:

1. A current measuring device for a switched-mode power converter configured to measure a current in a branch of the power converter, the current measuring device comprising a first sensor and a second sensor arranged in series circuit to provide an admittance and a conductance, wherein the measured current flows through the first and second sensors and has a root mean square value which is at least 1.4 times an average value of the current.

2. The current measuring device as claimed in claim 1, further comprising an average value capacitor, wherein the average value capacitor provides a susceptance of the admittance.

3. The current measuring device of claim 1, wherein the current measuring device is configured to simultaneously provide at least two different measurement voltages.

4. The current measuring device of claim 1, wherein the current measuring device is configured to generate a first measurement voltage, which is in parallel with the admittance and is proportional to a low-pass-filtered instantaneous value of the measured current, and is representative of the average value of the measured current.

5. The current measuring device of claim 1, wherein the current measuring device is configured to generate a second measurement voltage, which is proportional to an instantaneous value of the measured current, the second measurement voltage being in parallel with the conductance, and wherein the current measuring device is configured to generate a third measurement voltage corresponding to the sum of the first and second measurement voltages.

6. The current measuring device of claim 1, wherein a time constant of the admittance is greater than 0.2 times a greatest occurring period duration of the clocking of the power converter, and in that the time constant amounts to a maximum of 20 times said period duration.

7. The current measuring device of claim 1, wherein a time constant of the admittance is greater than 0.6 times a greatest occurring period duration of a clocking of the power converter, and wherein the time constant amounts to a maximum of 5 times said period duration.

8. The current measuring device of claim 1, wherein a conductance of the admittance is related to a nominal output power (Pnom) of the switched-mode electronic power converter and corresponds to a resistance of between 40 $V^2$/Pnom and 1000 $V^2$/Pnom.

9. The current measuring device of claim 1, wherein a conductance of the admittance corresponds to a resistance which is related to a nominal output power Pnom of the switched-mode power converter and has an ohmic value of between 80 $V^2$/Pnom and 400 $V^2$/Pnom.

10. The current measuring device of claim 2, wherein a conductance of the admittance corresponds to a resistance which is related to a nominal output power Pnom of the switched-mode power converter and has an ohmic value of between 80 V$^2$/Pnom and 400 V$^2$/Pnom, and in that the capacitance of the average value capacitor is likewise related to the nominal output power Pnom and amounts to from Pnom*25 ns/V$^2$ to Pnom*500 ns/V$^2$.

11. The current measuring device of claim 1, wherein a total conductance value of the conductance is 2 to 100 times higher than a total conductance of the admittance.

12. A regulation circuit configured for the current measuring device of claim 5, comprising
- a first function block comprising circuitry configured to implement a current regulation of a regulated power supply, said first function block configured to use the first measurement voltage as an input signal representing a present current,
- a second function block comprising circuitry configured to implement an overcurrent shutdown of the regulated power supply said second function block configured to use the third measurement voltage as an input signal representing the present current, the regulation circuit further comprising a matching network including a first and/or a second tracking filter, the matching network being connected between the first, second, and third measurement voltages and the first and second function blocks.

13. A regulation circuit configured for the current measuring device of claim 5, the regulation circuit comprising
- a first function block comprising circuitry configured to implement a current regulation of a regulated power supply, said first function block configured to use the third measurement voltage as an input signal representing a present current,
- a second function block comprising circuitry configured to implement an overcurrent shutdown of the regulated power supply, said second function block configured to use the second measurement voltage as an input signal representing the present current, the regulation circuit further comprising a matching network including a first and/or a second tracking filter, the matching network being connected between the first, second, and third measurement voltages and the first and second function blocks.

14. The regulation circuit of claim 12, wherein the first tracking filter is a low-pass filter having a time constant which amounts to 0.01 times to 100 times a time constant of the admittance.

15. The regulation circuit of claim 12, wherein the second tracking filter comprises a direct connection or of a series resistance between the current measuring device and an input of the second function block.

16. The regulation circuit of claim 12, wherein the second tracking filter is a low-pass filter having a time constant of between 10 ns and 100 μs.

17. The regulation circuit of claim 12, wherein the second tracking filter comprises a bandpass filter or of a band-stop filter.

18. The regulation circuit of claim 12, wherein each of the first function block and the second function block, and the matching network having the first tracking filter and the second tracking filter each comprise a microcontroller, a field programmable gate array (FPGA) or an application-specification integrated circuit (ASIC).

\* \* \* \* \*